(12) United States Patent
Jiang et al.

(10) Patent No.: US 12,068,129 B2
(45) Date of Patent: Aug. 20, 2024

(54) TILT-COLUMN MULTI-BEAM ELECTRON MICROSCOPY SYSTEM AND METHOD

(71) Applicant: KLA Corporation, Milpitas, CA (US)

(72) Inventors: Xinrong Jiang, Palo Alto, CA (US);
Youfei Jiang, Milpitas, CA (US);
Ralph Nyffenegger, Milpitas, CA (US);
Michael Steigerwald, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 102 days.

(21) Appl. No.: 17/981,141

(22) Filed: Nov. 4, 2022

(65) Prior Publication Data
US 2024/0153737 A1    May 9, 2024

(51) Int. Cl.
*H01J 37/28*      (2006.01)
*H01J 37/26*      (2006.01)

(52) U.S. Cl.
CPC ............ *H01J 37/28* (2013.01); *H01J 37/261* (2013.01)

(58) Field of Classification Search
CPC .. H01J 37/00; H01J 37/02; H01J 37/26; H01J 37/28; H01J 37/261; H01J 37/023; H01J 37/147; H01J 37/1478; H01J 37/265
USPC .................. 250/306, 307, 310, 311
See application file for complete search history.

(56) References Cited

U.S. PATENT DOCUMENTS

| | | | |
|---|---|---|---|
| 8,362,425 B2 | 1/2013 | Han et al. | |
| 10,497,536 B2 | 12/2019 | Brodie | |
| 2006/0289752 A1* | 12/2006 | Fukunishi | H01J 37/28 250/310 |
| 2017/0084424 A1 | 3/2017 | Masnaghetti et al. | |
| 2019/0227010 A1 | 7/2019 | Brodie et al. | |
| 2020/0035447 A1* | 1/2020 | Kruit | H01J 37/228 |
| 2020/0286705 A1 | 9/2020 | Liu et al. | |

FOREIGN PATENT DOCUMENTS

| | | |
|---|---|---|
| KR | 1020050056923 A | 6/2005 |
| WO | 2022008286 A1 | 1/2022 |

OTHER PUBLICATIONS

Korean Intellectual Property Office, International Search Report and Written Opinion received in International Application No. PCT/US2023/036327, Feb. 21, 2024, 8 pages.

* cited by examiner

*Primary Examiner* — Jason L McCormack
(74) *Attorney, Agent, or Firm* — Suiter Swantz IP

(57) ABSTRACT

A system and method of a tilt-column electron beam imaging system is disclosed. The system may include an imaging sub-system. The imaging sub-system may include a plurality of electron beam sources configured to generate a plurality of beamlets. The imaging sub-system may further include a plurality of tilt-illumination columns, where a respective tilt-illumination column is configured to receive a respective beamlet from a respective electron beam source. For the system and method, a first tilt axis of a first tilt-illumination column may be orientated along a first angle and at least one additional tilt axis of at least one additional tilt-illumination column may be orientated along at least one additional angle different from the first angle, where each of the plurality of beamlets pass through a first common crossover volume.

29 Claims, 19 Drawing Sheets

TILT-COLUMN MULTI-BEAM ELECTRON MICROSCOPY SYSTEM AND METHOD

TECHNICAL FIELD

The present disclosure relates generally to electron beam devices and, more particularly, to electron beam devices with multiple illumination columns for high-throughput sampling.

BACKGROUND

The fabrication of semiconductor devices, such as logic and memory devices, typically includes processing a semiconductor device using a large number of semiconductor fabrication processes to form various features and multiple levels of the semiconductor devices. Some fabrication processes utilize photomasks/reticles to print features on a semiconductor device such as a wafer. As semiconductor devices become smaller and smaller, it becomes critical to develop enhanced inspection and review devices and procedures to increase the resolution, speed, and throughput of wafer and photomask/reticle inspection processes.

One inspection technology includes electron beam based inspection such as scanning electron microscopy (SEM). In some instances, scanning electron microscopy is performed by splitting a single electron beam into numerous beams/beamlets and utilizing a single electron-optical column to individually tune and scan the numerous beamlets. This may introduce potential issues across the multiple beamlets such as nonuniformity in the beamlets caused by electron source non-uniformity. Further issues may include field curvature, astigmatism, distortion, and other unwanted effects that may be difficult to correct for. As the number of beamlets increases, these issues may become more difficult to correct for all beamlets.

Therefore, it would be advantageous to provide a system that cures the shortcomings described above.

SUMMARY

A tilt-column electron beam imaging system is disclosed, in accordance with one or more embodiments of the present disclosure. The system may include an imaging sub-system. In one illustrative embodiment, the imaging sub-system may include a plurality of electron beam sources configured to generate a plurality of beamlets to simultaneously probe a plurality of measurement regions on a sample. In another illustrative embodiment, the imaging sub-system may further include a plurality of tilt-illumination columns, where a respective tilt-illumination column is configured to receive a respective beamlet from a respective electron beam source. In another illustrative embodiment, the respective tilt-illumination column includes a set of one or more electron optics configured to adjust the respective beamlet. In another illustrative embodiment, a first tilt axis of a first tilt-illumination column may be orientated along a first angle and at least one additional tilt axis of at least one additional tilt-illumination column may be orientated along at least one additional angle different from the first angle, where each of the plurality of beamlets pass through a first common crossover volume.

A method is disclosed, in accordance with one or more embodiments of the present disclosure. In one illustrative embodiment, the method may include, but is not limited to, generating electrons of a plurality of beamlets using a plurality of electron beam sources. In another illustrative embodiment, the method may include adjusting each beamlet with respective electron optics of a respective tilt-illumination column configured to receive the beamlet from a respective electron beam source. In another illustrative embodiment, the method may include simultaneously illuminating a plurality of measurement regions of a sample with the plurality of beamlets. In another illustrative embodiment, the method may include collecting secondary electrons emanating from the plurality of measurement regions of the sample utilizing a detector. In another illustrative embodiment, the method may include detecting the secondary electrons using the detector. In another illustrative embodiment, a first tilt axis of a first tilt-illumination column may be orientated along a first angle and at least one additional tilt axis of at least one additional tilt-illumination column may be orientated along at least one additional angle different from the first angle, where each of the plurality of beamlets pass through a first common crossover volume.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to an electron beam system including a set of tilted illumination columns for generating a set of beamlets to simultaneously probe a set of regions on a sample. Additional embodiments of the present disclosure are directed to an electron beam system including a set of double-tilt-illumination columns, where the beamlets propagate along a second tilt axis. Additional embodiments of the present disclosure are directed to an electron beam system including a global condenser lens. Additional embodiments of the present disclosure are directed to an electron beam system and method including a set of tilt-illumination columns arranged in an array (e.g., hexagonal array).

Figure 1:
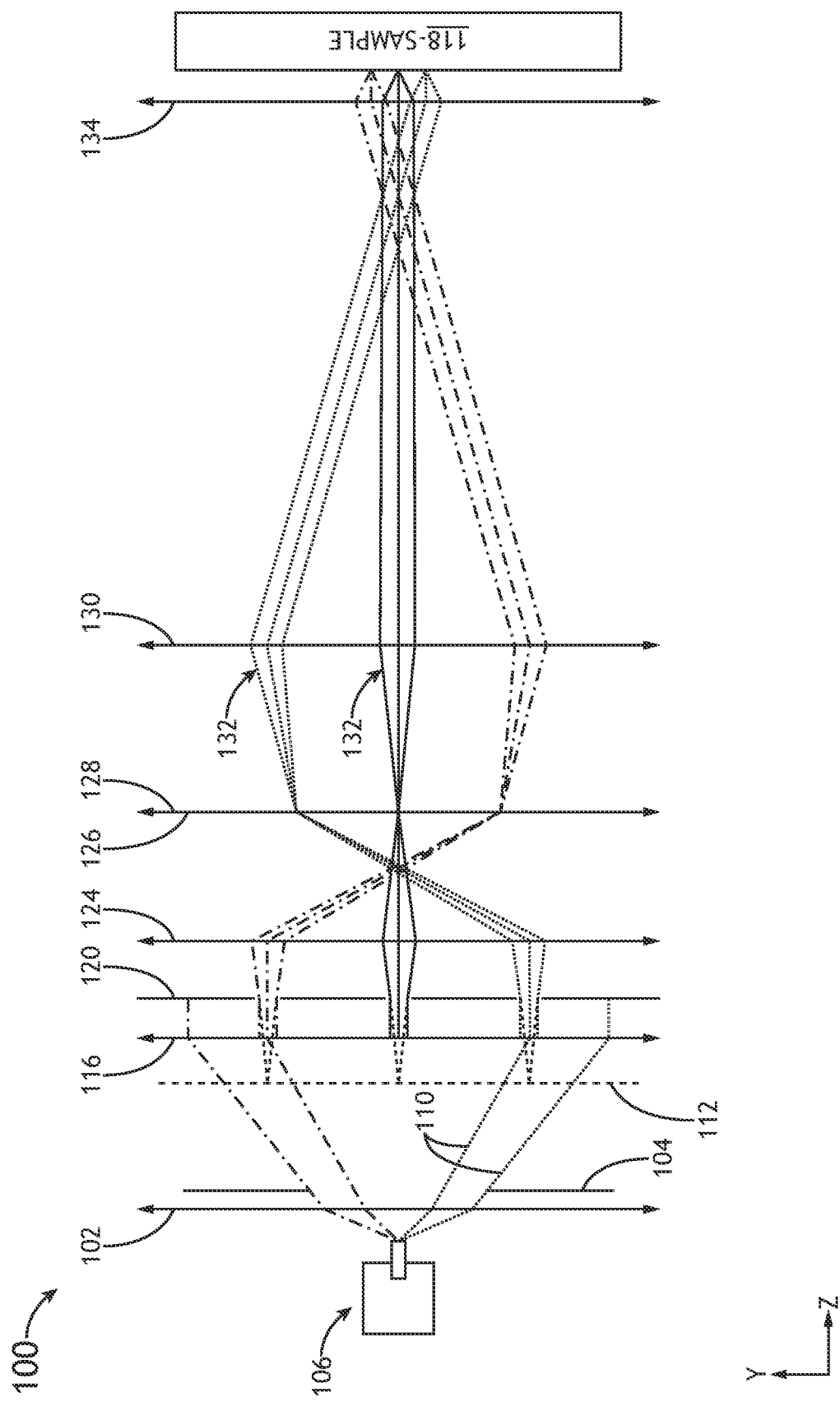
FIG. 1 is a simplified schematic view of a system including a single electron beam source.

One method of generating a set of beamlets involves the use of a single source to produce a single beam directed along a central axis and then split the beam into multiple beamlets. For example, generating and splitting an electron beam into multiple beamlets is disclosed in U.S. Pat. No. 8,362,425, issued Jan. 29, 2013, which is hereby incorporated by reference in its entirety. FIG. 1 illustrates a single source electron beam being split into multiple beamlets and is described further below. It is noted that generating a uniform single beam is difficult. Variations in the beamlets caused by the original non-uniform beam may result in unwanted variations in the sampling data obtained from each beamlet.

It is recognized herein that, as the number of beamlets split from a single source increases, issues related to source emission uniformity and field curvature, astigmatism, and distortion of the beamlets may become impractical to overcome.

It would be advantageous to provide a system that addresses the challenges observed in single-source electron beam imaging systems. It is contemplated that using multiple electron beam sources may address some challenges but some configurations (e.g., non-tilted configurations) may present challenges. For example, using individual electron beam sources for each beamlet may increase the uniformity of the beamlets. However, the utilization of multiple beam sources creates a risk of excessive heat accumulation. For example, for arrays of beamlets, packing the beam sources close together and parallel to a central axis may cause a damaging level of heat accumulation which may require complicated cooling mechanisms and/or cause thermal expansion-based distortions that affect optical alignment. For instance, parallel arrays of thermal field emission (TFE) sources may cause such excessive heat accumulation. Further, it is contemplated that each illumination column—one for each beamlet—may also have its own illumination components (e.g., illumination optics) to individually adjust each beamlet, such as may be used to adjust for astigmatism, field curvature, distortion, and the like.

Typically, an emission angular distribution of a TFE source is a Gaussian distribution. If the emission angle is too large, the angular intensity distribution may be highly inhomogeneous. Generating higher numbers of beamlets may call for higher emission angles. For example, using an emission angle of ~90 mrad with a single 800 μm diameter beam limiting aperture may cause inhomogeneity between beamlets.

For a set of beamlets generated with a micro-lens array (MLA), the field curvature, astigmatism, and distortion may be directly proportional to the square and cubic of the field of view (FOV) size at the sample. Increasing the FOV size, or increasing the number of beamlets for higher throughputs, may sharply increase the field curvature, astigmatism, and distortion, making corrections potentially impractical to perform. MLAs are micro-dimensional chip devices that require relatively complicated micro-fabrication techniques and sophisticated skills to operate.

It is contemplated that such challenges may be overcome by using a configuration of multiple electron beam sources and tilted illumination columns. In this regard, tilting each column may create more separation between individual electron beam sources and illumination components of each column. Separation of components of such a system may allow for benefits such as less heat accumulation, more space for individual beamlet illumination optics, not needing to use complicated MLAs, reduced cross-talk between beamlets because focusing and deflecting fields for each beamlet in the tilt-illumination columns may be independent with relatively far separation from each other, and the tilted orientation of the columns allowing for the use of global collection optics. Individual illumination optics may allow for adjusting the numerical aperture (NA) of each beamlet to improve resolution uniformity across the FOV, adjusting the brightness of each beamlet for better resolution uniformity across the FOV, modular replaceability of each electron beam source in the field, accurately measuring beam current of each beamlet by blanking off all other beamlets for accurate calibration of each detector chancel, and modular replaceability of a gun lens module including a beam limiting aperture, gun lens, modulator, and secondary beam limiting aperture.

FIG. 1 illustrates a simplified schematic view of a single source system 100.

As noted previously herein, using a single electron beam source to generate beamlets may lead to challenges related to source uniformity and astigmatism, distortion, and field curvature of the beamlets.

The single source system 100 may include a single electron beam source 106. The single source system 100 may further include a beam limiting aperture 104, a gun lens 102, a collimation lens 116, a micro-lens array (MLA) chip 120, an imaging lens 124, a field lens 128, a transfer lens 130, and/or an objective lens 134. The micro-lens array (MLA) chip may include a defocusing lens array to split the global telecentric beam into multiple beamlets 132. The imaging lens 124 may form the beamlets 132 on an intermediate image plane 126 at the field lens 128. The plane 112 may be considered as a virtual object plane (VOP) of the multi electron beamlets 132.

Figure 2:
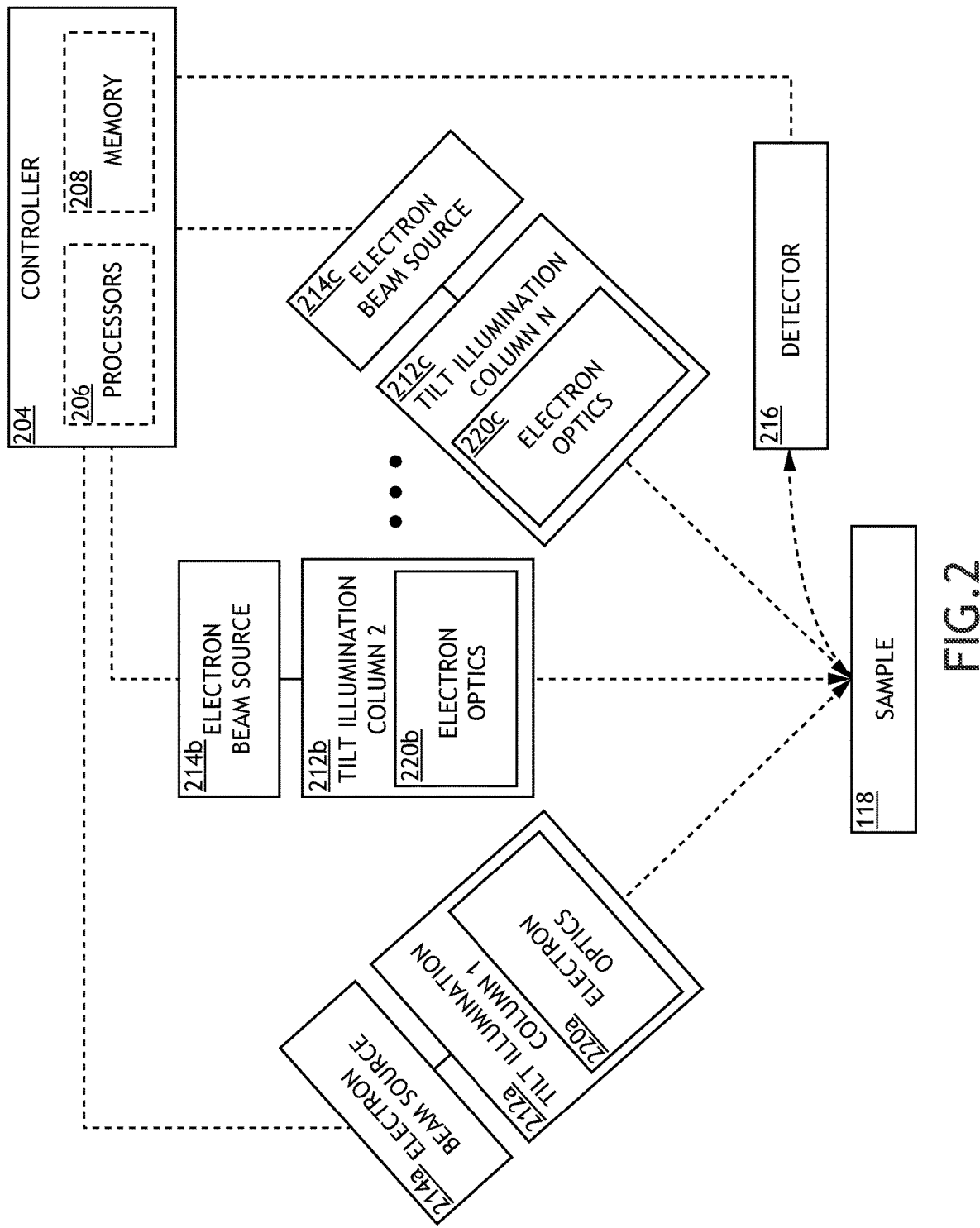
FIG. 2 is a simplified block diagram view of a tilt-column electron beam imaging system, in accordance with one or more embodiments of the present disclosure.

FIG. 2 illustrates a simplified block diagram view of a tilt-column electron beam imaging system 200, in accordance with one or more embodiments of the present disclosure. In embodiments, the tilt-column electron beam imaging system 200 is configured to generate a set of beamlets to simultaneously probe a set of measurement regions on a sample 118. In embodiments, the tilt-column electron beam imaging system 200 is configured for inspection (e.g., mask or wafer inspection) or imaging-based metrology.

In embodiments, the tilt-column electron beam imaging system 200 includes an imaging sub-system 202 and a controller 204. The controller 204 may include one or more processors 206 configured to execute program instructions maintained on memory 208.

In embodiments, imaging sub-system 202 includes a set of electron beam sources 214 configured to generate a set of beamlets to simultaneously probe a set of measurement regions on a sample 118. For example, the imaging sub-system 202 may include, but is not limited to, electron beam sources 214a, 214b, and 214c.

Using multiple electron beam sources 214 may allow for independently selecting beam currents and correcting distortions and the blurs of field curvature and astigmatism of each beamlet. Compared to beamlets of MLAs, the electron beam sources 214 may be spaced apart a relatively larger distance (e.g., tens of millimeters, 10 mm or more, 20 mm or more, 30 mm or more, 40 mm or more, and the like). Further, the influence of Coulomb interactions between the beamlets 394 on resolutions may be negligible because the beamlets 394 may be long-distance separated compared to the average separation of the electrons of a single source beam.

In embodiments, the imaging sub-system 202 includes a set of tilt-illumination columns 212. For example, the tilt-illumination columns 212 may include tilt-illumination columns 212a, 212b, and 212c. In embodiments, each tilt-illumination column 212 is configured to receive a beamlet from an electron beam source 214.

In embodiments, each tilt-illumination column 212 includes a set of one or more electron optics 220 configured to adjust a beamlet. For example, the electron optics 220 may include, but are not limited to, electron optics 220a, 220b, and 220c. In this regard, for example, each tilt-illumination column 212 may be associated with, and configured to adjust, a beamlet generated by an electron beam source 214.

In embodiments, the imaging sub-system 202 includes one or more detectors 216.

Figure 3A:
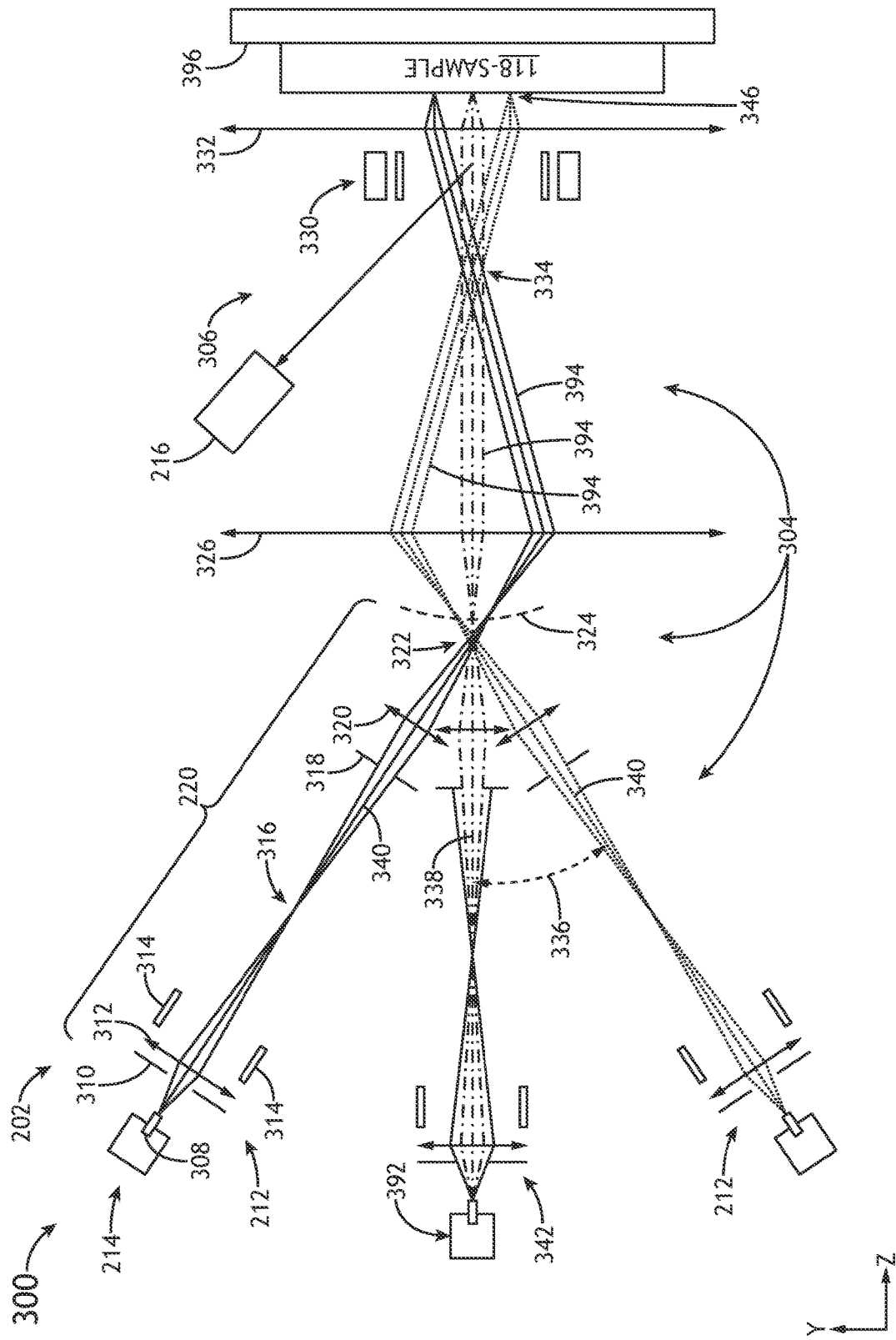
FIG. 3A is a simplified schematic view of a tilt-column electron beam imaging system including multiple electron beam sources, in accordance with one or more embodiments of the present disclosure.

FIG. 3A illustrates a simplified schematic view 300 of a tilt-column electron beam imaging system 200, in accordance with one or more embodiments of the present disclosure.

In embodiments, the tilt-column electron beam imaging system 200 includes an illumination pathway 304 and a collection pathway 306. The illumination pathway 304 is defined as including a path that electrons (e.g., beamlets 394 and the like) travel from generation at a source (e.g., electron beam source 214) until reaching the sample 118 and any components associated with such a pathway such as modulators. Modulators include, but are not limited to, apertures, deflectors, lenses, filters, and the like. The collection pathway 306 is defined as including a path that electrons (e.g., secondary electrons, backscattered electrons, and the like) emanating from the sample 118 take on their journey to a detector 216 and any components associated with such a pathway such as the detector 216 or particle modulators (e.g., Wien filters, apertures, attractors, and the like).

In embodiments, a tilt axis 340 may be used to define a general direction of propagation of at least a portion of a beamlet 394 that is tilted. In embodiments, at least a portion of a path of a beamlet 394 is configured to pass along the first tilt axis 340 and through a first common crossover volume 322. For example, a tilt axis 340 associated with a particular beamlet 394 is defined along a direction of propagation of a portion of the beamlet 394 that is immediately in front of its associated electron beam source 214 and/or a portion immediately before the first common crossover volume 322.

In embodiments, a first tilt axis 340 of a first tilt-illumination column 212 is orientated along (e.g., parallel to) a first angle 336 and at least one additional tilt axis 340 of at least one additional tilt-illumination column 212 is orientated along at least one additional angle 336 different from the first angle. Referring to FIG. 3A, the first tilt axis 340 may be the axis labeled 340 near the top and the at least one additional tilt axis 340 may be the axis labeled 340 near the bottom.

In embodiments, each of the plurality of beamlets 394 pass through a first common crossover volume 322.

In embodiments, angle 336 is a non-zero angle between the first tilt axis 340 of a tilt-illumination column 212 and a central axis 338. In this regard, the tilt-illumination columns 212 may be non-parallel relative to the central axis 338. Although the angle 336 is shown relative to a central illumination column 342, the angle 336 may also be measured between tilt axes 340 of different tilt illumination columns 212.

In embodiments, the first tilt axis 340 of each tilt-illumination column 212 is at a (non-zero) angle 336 relative to other first tilt axes 340 of other tilt-illumination columns 212. For example, the first tilt axes 340 of the tilt-illumination columns 212 may be radially arranged, such as being normal (i.e., perpendicular) to a 3-dimensional curved plane. For instance, the beamlets 394 may allow for the electron beam sources 214 to be spaced apart. In this regard, the 3-dimensional curved plane may be a portion of a sphere.

However, note that such an example is nonlimiting and the first tilt axes 340 may be arranged normal to portions of other curved shapes such as, but not limited to, ellipsoids, cones, toroidal cylinders, and the like. For example, such a curved surface may be convex when viewed facing a direction of propagation of a beamlet 394.

Figure 5:
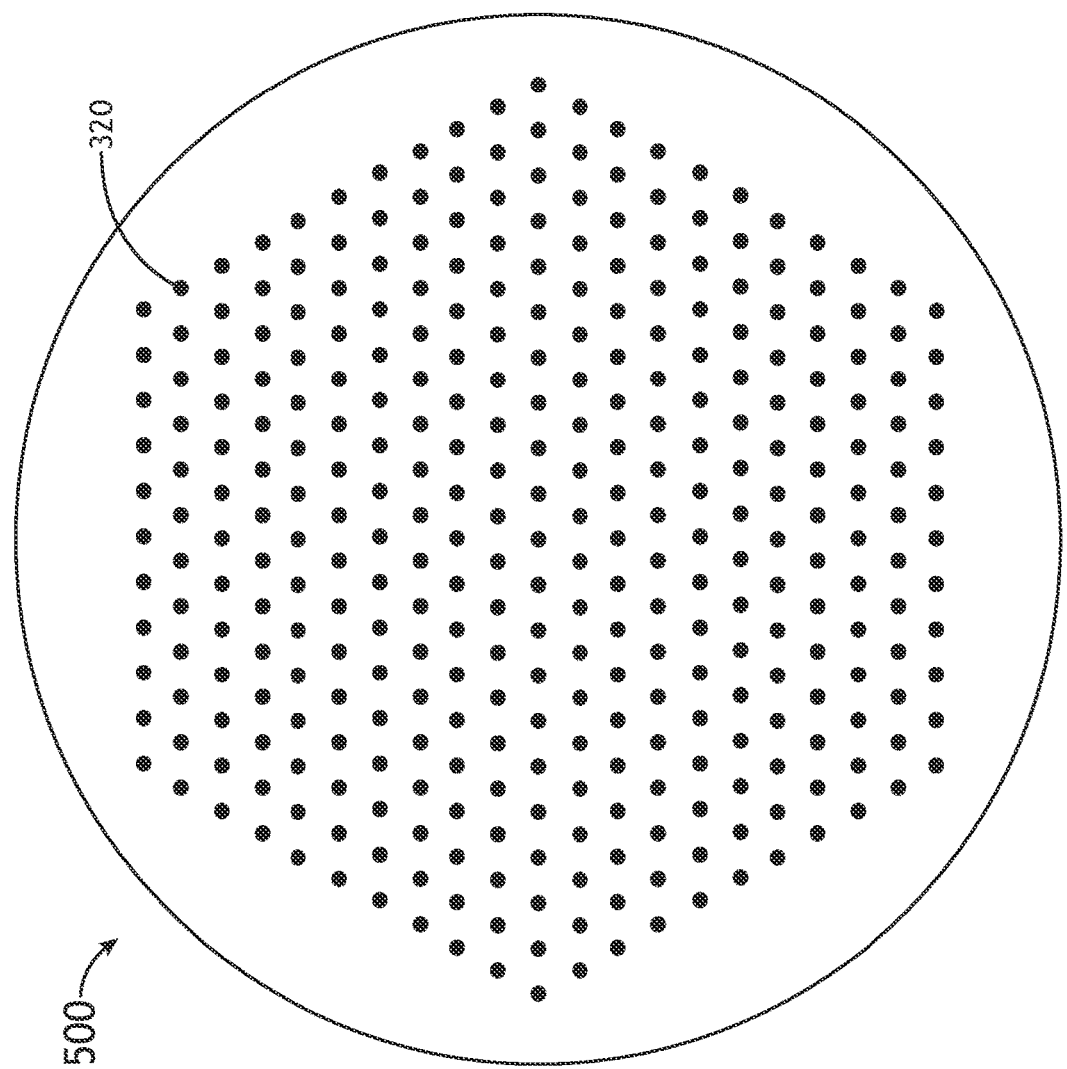
FIG. 5 is a schematic view of a 2-dimensional projection of a spherical electrode layer of a condenser lens array, in accordance with one or more embodiments of the present disclosure.

In embodiments, the beamlets 394 are (at least partially) rotationally-symmetric with respect to the central axis 338. For example, an angular pitch between the beamlets 394 may be equal. In some embodiments, the beamlets 394 may be in specific distributions (e.g., a hexagon distribution as shown in FIG. 5).

In embodiments, each tilt-illumination column 212 includes a set of one or more electron optics 220. For example, a set of one or more electron optics 220 may be used to individually modulate (e.g., direct, deflect, focus, selectively filter, adjust, and/or the like) a beamlet 394 in the illumination pathway 304. In this regard, each tilt-illumination column 212 may individually adjust its own beamlet 394 to, for example, adjust for astigmatism, field curvature, focus, and the like.

In embodiments, the imaging sub-system 202 includes a set of the electron source emitter tips 308 in the illumination pathway 304. In embodiments, the imaging sub-system 202 includes a set of the gun lenses 312 in the illumination pathway 304. For example, each electron beam source 214 may be coupled to (or include) a source emitter tip 308 and/or a gun lens 312 associated with a beamlet 394.

In embodiments, a gun lens 312 is used to focus the beamlet 394 on a beamlet crossover 316.

In embodiments, the imaging sub-system 202 (e.g., the set of one or more electron optics 220) includes a beam limiting aperture 310 for each beamlet 394. For example, the beam limiting aperture 310 may be located before a gun lens 312 relative to a direction of propagation of the beamlet 394. The beam limiting aperture 310 may be used to select a raw beam current of the beamlet 394.

In embodiments, the set of one or more electron optics 220 includes a condenser lens 320 for each beamlet 394. For example, each beamlet 394 may be associated with a condenser lens 320.

In embodiments, the set of one or more electron optics 220 includes a modulator 314 for each beamlet 394. For example, the modulator 314 may be configured to at least one of deflect the beamlet 394 or otherwise adjust (e.g., focus and the like) the beamlet 394. In embodiments, the modulator 314 is used to corrector for astigmatism and/or deflect the beamlet 394 to correct for distortions. For example, the modulator 314 may be a stigmator to correct for astigmatism. By way of another example, the modulator 314 may be used as a deflector to align the beamlet 394 for eliminating mechanical tolerance and for correcting distortions. By way of another example, the modulator 314 may be used as a scanner. For instance, the modulator 314 may be used to scan the beamlet along a scanning direction of the sample 118 to expand the measurement region 346 in such a direction. In embodiments, the modulator 314 consists of eight cylindrical plates. Such a configuration may generally be used in electron optics as an octupole configuration, where different voltages are applied to the modulator 314 for use as a stigmator or a deflector.

For example, the modulator 314 may include an electron-beam stigmator 314. For instance, the one or more electron-beam stigmators may include, but are not limited to, one or more multi-pole beam deflectors. In this regard, the one or more multi-pole beam deflectors may include, but are not limited to, one or more quadrupole beam deflectors and/or one or more octupole beam deflectors. By way of another example, the one or more electron-beam stigmators may include, but are not limited to, one or more sets of slitted beam stigmators. For example, the one or more sets of slitted beam stigmators may include apertures. In embodiments, the one or more modulators 314 adjust one or more characteristics (e.g. field of view position on the sample 118, amount of lens field astigmatism, or the like) of the beamlets 394.

In embodiments, the set of one or more electron optics 220 includes a secondary beam limiting aperture 318 for each beamlet 394. For example, the secondary beam limiting aperture 318 may be located after the gun lens 312. The secondary beam limiting aperture 318 may be used to adjust the raw beam current. For example, a voltage applied to the gun lens 312 may be adjusted to change the location of the beamlet crossover 316, and therefore how much of the beamlet 394 is affected by the secondary beam limiting aperture 318.

In embodiments, although the beamlet 394 is shown with a beamlet crossover 316, the beamlet crossover 316 is not required. For example, in some embodiments no beamlet crossover 316 necessarily exists between the gun lens 312 and the secondary beam limiting aperture 318.

In embodiments, the illumination pathway 304 further includes a global transfer lens 326. For example, the global transfer lens 326 may be configured to direct each of the beamlets 394 from a diverging path to a converging path and towards a second common crossover volume 334. For instance, the global transfer lens 326 may be located after the first common crossover volume 322.

In embodiments, the illumination pathway 304 further includes a global objective lens 332. For example, the global objective lens 332 may be configured to direct each of the beamlets 394 to be telecentrically directed to (i.e., formed on) the sample. For instance, the global objective lens 332 may be located after a second common crossover volume 334.

In embodiments, each beamlet 394 is directed to a different measurement region 346 as shown. It should be noted that each beamlet 394 may also be considered to be configured to measure a field of view (FOV). Multiple (e.g., several, dozens, 200s, or the like) of FOVs may be aligned in an array on the sample to simultaneously probe (e.g., measure) multiple measurement regions 346 on the sample 118 using multiple beamlets 394.

In embodiments, the collection pathway 306 includes a Wien filter 330 configured to separate primary electrons from secondary electrons. The primary electrons are generally the electrons of the beamlets 394 as they approach the sample 118 and secondary electrons are a type of electron that emanates back from the sample 118. The Wien filter 330 may be used to direct (e.g., separate) the secondary electrons towards a detector 216 configured to detect secondary electrons.

In embodiments, the imaging sub-system 202 includes a central illumination column 342. For example, the central illumination column 342 may include a central electron beam source 392 configured to generate a central beamlet 394 along the central axis 338.

Figure 3B:
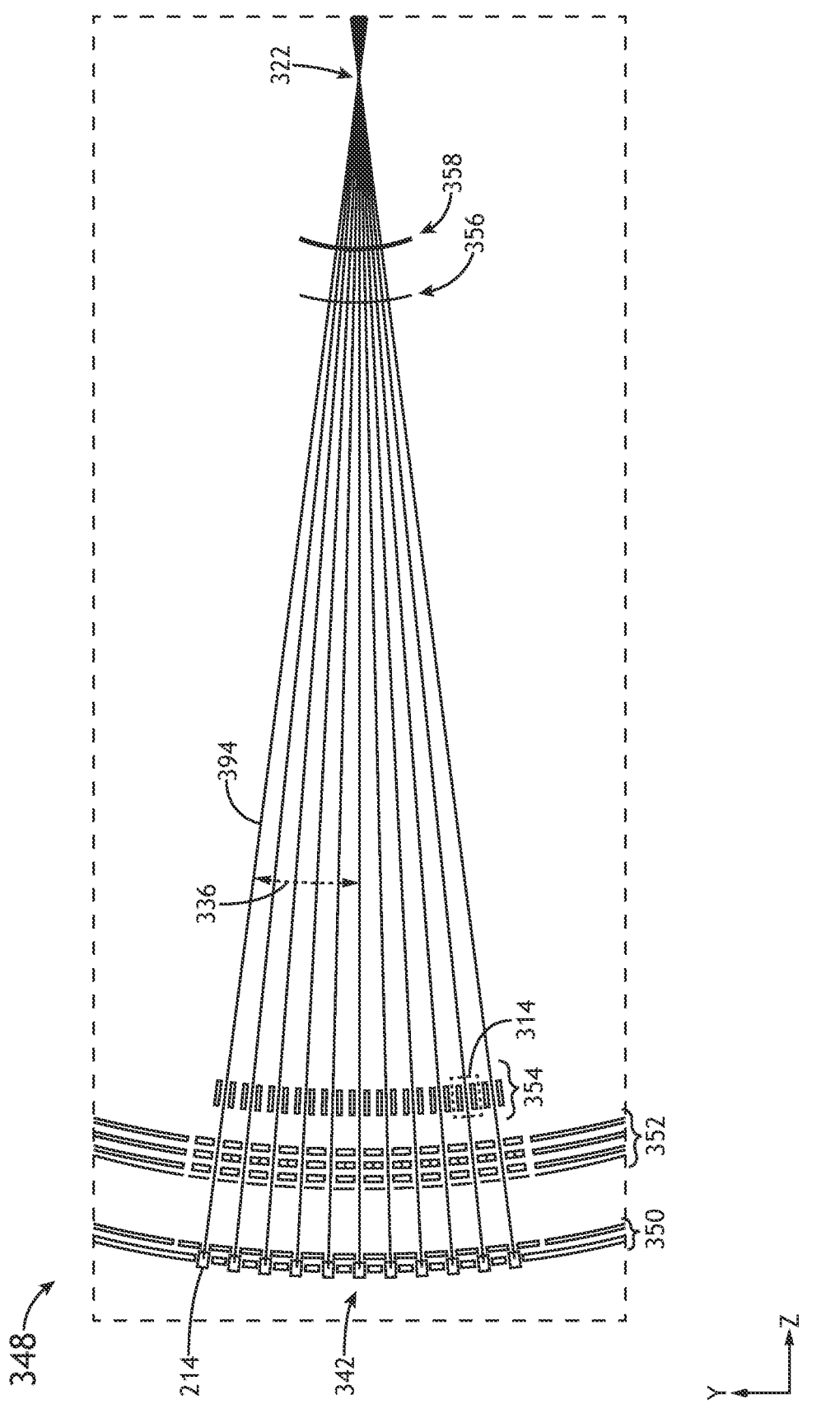
FIG. 3B is a simplified schematic view of an upper column area of a tilt-column electron beam imaging system, in accordance with one or more embodiments of the present disclosure.

FIG. 3B illustrates a simplified schematic view 348 of an upper column area of a tilt-column electron beam imaging system 200, in accordance with one or more embodiments of the present disclosure. While FIG. 3A illustrates two tilt-illumination columns 212—one on each side of the central illumination column 342—FIG. 3B illustrates ten tilt-illumination columns 212, five on each side of the central illumination column 342.

In embodiments, elements are positioned in an array of a layer. For example, the illumination pathway 304 may include multiple layers, where each layer includes an array of an element. Layers may be adjacent to other layers to form a grouping of such layers (i.e., a set of adjacent layered arrays such as gun lens array 352). In embodiments, elements in a layer may be electrically connected or independent. For example, a single, non-separated, electrically-conductive spherical plate with voids for beamlets 394 may be grounded or excited as a single component. By way of another example, elements of a layer may be individual and electrically separated such that, for example, a different voltage may be individually and simultaneously applied to each element in the layer. Elements may include, but are not limited to, voids configured to receive a beamlet, apertures sized to selectively block a portion of a beamlet, or any other type of modulator. Layers and/or elements may be grounded (i.e., have an electrically grounded potential of zero) or activated (e.g., excited by an applied voltage). For example, an activatable element may be configured to accelerate, decelerate, focus, and/or deflect a beamlet 394. Each element of an array may be associated with an electrostatic field. Each element may have equal dimensions to other voids in the same layer, but are not required to.

In embodiments, each layer includes multiple "dummy" elements 366 (e.g., dummy grounded elements, dummy excitation elements) not associated with a beamlet 394 but included to provide for consistent/uniform properties (e.g., consistent electrostatic field of each element, consistent acceleration/focusing of a beamlet, consistent thermal expansion, and the like). For example, dummy elements 366 may be used to create homogenous electrostatic fields for the active voids. For instance, the dummy elements 366 may be dummy voids and may be used to increase the uniformity of electrical properties of the grounded elements 360 near the outer edge of the array of grounded elements 360. For instance, an extra row or more of voids may be fabricated outside and adjacent to voids configured to receive beamlets 394. For instance, the extra voids and the voids configured to receive the beamlets 394 may be equidistant from each other.

While illustrated as a cross sectional, radially arranged, 2-dimensional, arc-shaped layer of elements in FIG. 3B, a quantity (e.g., any quantity) of elements (e.g., modulators 314) may be arranged in a 3-dimensional array in accordance with embodiments of the present disclosure. For instance, each layer may be spherically-shaped such that beamlets 394 associated with such layers are directed through such layers.

In embodiments, each of the plurality of tilt-illumination columns 212 is associated with an electron beam source 214. For example, the tilt-column electron beam imaging system 200 may include an array of electron beam sources 214 of an electron beam source array 350.

In embodiments, each of the plurality of tilt-illumination columns 212 includes a modulator 314. For example, the tilt-column electron beam imaging system 200 may include an array of modulators 314 of a modulator layer of a modulator array 354. For example, each modulator 314 may be configured to modulate a beamlet 394.

In embodiments, each of the plurality of tilt-illumination columns 212 includes a secondary beam limiting aperture 318. For example, the tilt-column electron beam imaging system 200 may include an array of secondary beam limiting apertures 318 of a secondary beam limiting aperture layer of a secondary beam limiting aperture array 356.

In embodiments, each of the plurality of tilt-illumination columns 212 includes a condenser lens 320. For example, the tilt-column electron beam imaging system 200 may include an array of condenser lenses 320 of a condenser lens layer of a condenser lens array 358.

In embodiments, the tilt-column electron beam imaging system 200 includes an array of various elements of various layers of a gun lens array 352. An example gun lens array 352 is described further in reference to FIG. 4 below.

Figure 3C:
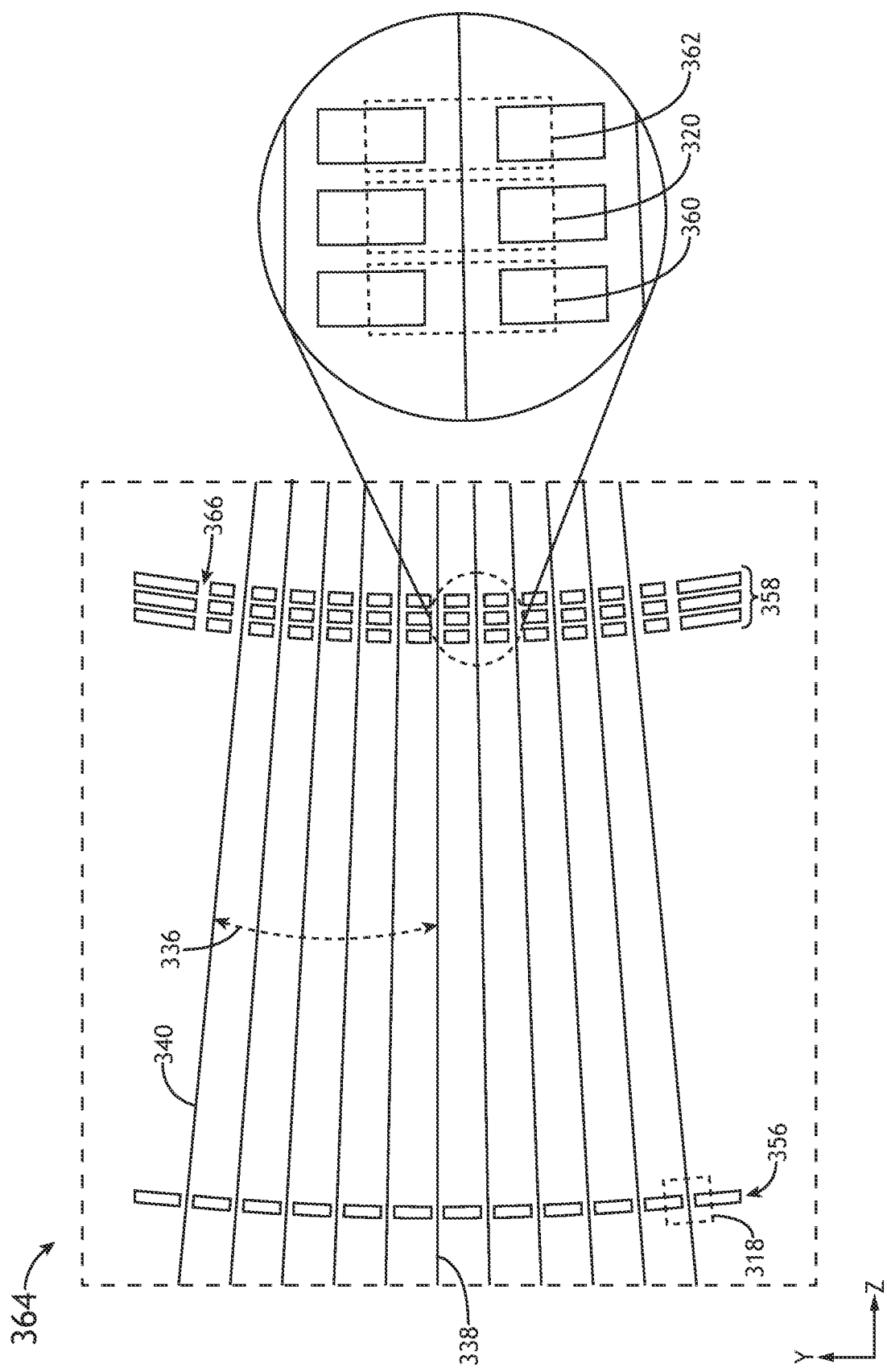
FIG. 3C is a simplified schematic view of a mid-upper column area of a tilt-column electron beam imaging system, in accordance with one or more embodiments of the present disclosure.

FIG. 3C illustrates a simplified schematic view 364 of a mid-upper column area of a tilt-column electron beam imaging system 200, in accordance with one or more embodiments of the present disclosure. FIG. 3C is an enlarged portion of FIG. 3B.

In embodiments, the secondary beam limiting aperture array 356 includes an array of secondary beam limiting apertures 318.

In embodiments, the condenser lens array 358 includes multiple (e.g., three) adjacent condenser layers. For example, each condenser layer may be an electrode with voids (e.g., holes). For instance, each void may be hundreds of microns in size (e.g., diameter). By way of another example, each hole axis may intersect at the first common crossover volume 322. The voids may align such that the beamlets 394 pass through the voids. For example, the voids may be spaced apart by hundreds of microns. Such dimensions may also apply to elements of other layers of other arrays (e.g., arrays 350, 352, 354, 356). Note that elements of aperture arrays such as aperture array 356, however, may be smaller-such as a size of tens of microns. The condenser lens 320 in FIG. 3A may include the condenser lens element 320 of FIG. 3C.

In embodiments, the adjacent condenser layers include a condenser excitation layer and two grounded condenser layers. For example, the condenser excitation layer may include condenser lenses 320 configured for excitation. For instance, a selected voltage may be applied to the condenser excitation layer to focus the beamlets 394 on the intermediate image plane 324 of FIG. 3A. In this regard, a variation in the selected voltage may provide for a variation in the location of the intermediate image plane 324 where each beamlet 394 focuses. In the same or alternative example, the condenser lens array 358 may include two grounded condenser layers of condenser grounded elements 360 and 362. One grounded condenser layer may be located on each side of, and adjacent to, the condenser excitation layer. Each condenser grounded element 360, 362 may include a void (e.g., hole) defined by a surface (e.g., inner surface of a hole). For example, a grounded condenser layer may be a spherical plate with spherically aligned holes configured to be fabricated (e.g., machined, molded, etched).

The intermediate image plane is the object plane of the projection optics. A plane (not shown) being imaged in focus on the sample 118 is the image plane of the projection optics. For example, the plane may be at an outer surface or at a depth within the sample 118.

Figure 4:
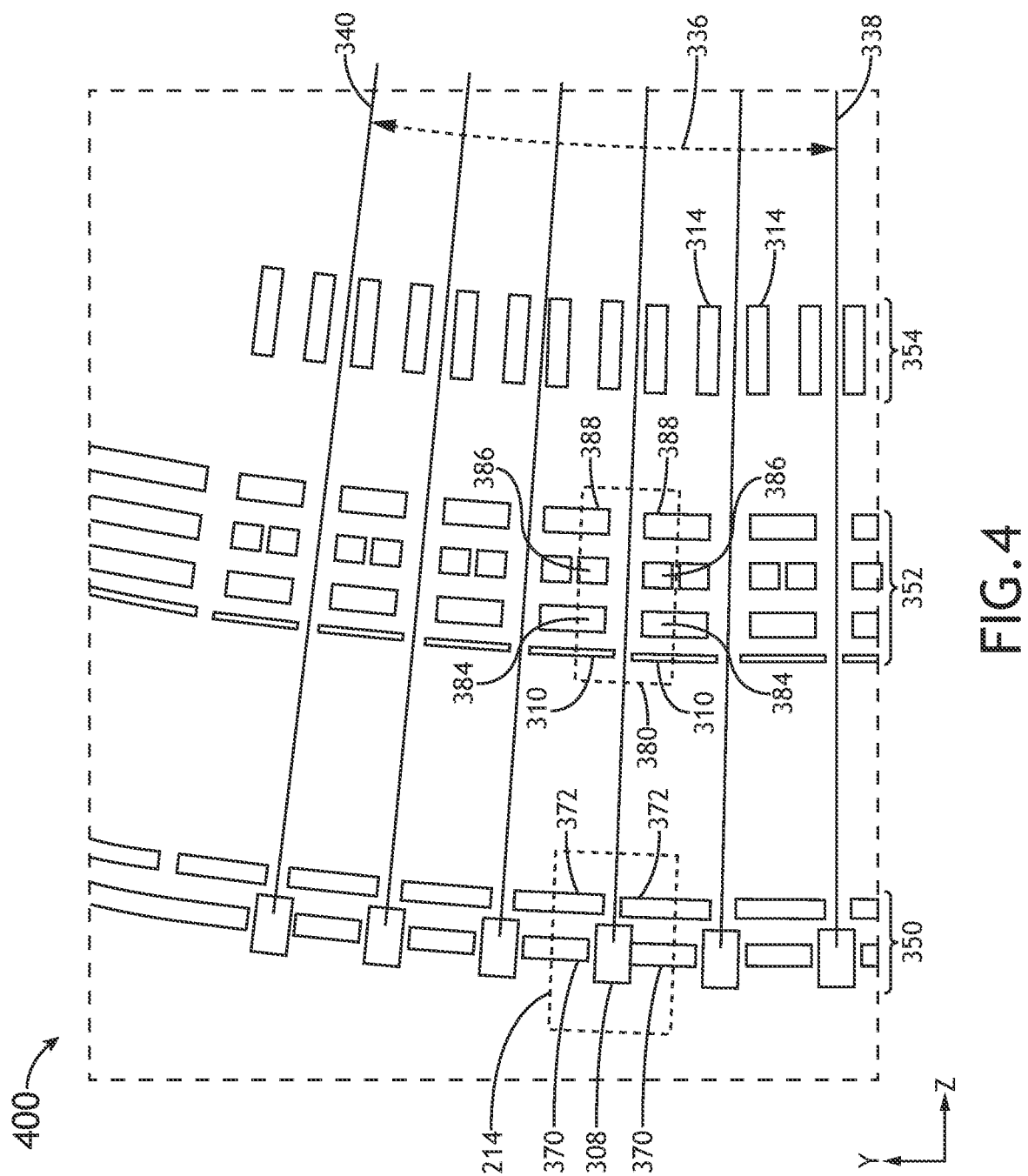
FIG. 4 is a simplified schematic view of a high-upper column area of a tilt-column electron beam imaging system, in accordance with one or more embodiments of the present disclosure.

FIG. 4 illustrates a simplified schematic view 400 of a high-upper column area of a tilt-column electron beam imaging system 200, in accordance with one or more embodiments of the present disclosure. FIG. 4 is an enlarged portion of FIG. 3B.

As noted previously herein, in embodiments, the tilt-column electron beam imaging system 200 includes an electron beam source array 350, a gun lens array 352, and a modulator array 354.

In embodiments, the electron beam source array 350 includes an array of electron beam sources 214. For example, the electron beam source array 350 may include adjacent layers of source emitter tips 308, source-holder elements 370, and source excitation elements 372. In embodiments, a void size (e.g., hole diameter) of the source-holder elements 370 is in millimeters (e.g., more than 1 millimeter), and a void size of the source excitation elements 372 is roughly hundreds of microns (e.g., more than 200 microns but less than 1 millimeter).

In embodiments, the gun lens array 352 includes an array of gun lens sub-systems 380. For example, the gun lens array 352 may include adjacent layers of beam limiting apertures 310, gun lens excitation elements 384, gun lens elements 386, and gun lens ground elements 388.

In embodiments, a voltage applied to the source excitation elements 372 is equal to a voltage applied to the gun lens excitation elements 384. For example, a potential on the source excitation elements 372 and the gun lens excitation elements 384 may be several kilovolts higher than a potential of the source emitter tips 308. Further, a potential of the gun lens elements 386 may be between the potential (e.g., zero) of the gun lens ground elements 388 and the potential of the gun lens excitation elements 384. For instance, for a 30 kV beamlet amount of energy, the potential of the source emitter tips 308 may be about −30 kV (negative 30 kV), the potential of the source excitation elements 372 and the gun lens excitation elements 384 may be around −25 kV, and the potential of the gun lens elements 38 may be between −10 to −20 kV for focusing the beamlet 394 and selecting the beam currents to move the beamlet crossovers 316.

FIG. 5 illustrates a schematic view of a 2-dimensional projection 500 of a spherical electrode layer of a condenser lens array 358, in accordance with one or more embodiments of the present disclosure. In embodiments, the condenser lens array 358 is an array of condenser lenses 320. In embodiments, FIG. 5 may illustrate an XY-plane view of the condenser lens array 358 of FIG. 3B as projected onto the XY-plane. Note that the projection of the condenser lens array 358 may be equal or similar to a stereographic projection (rather than a plane projection), but where elements that are spherically equidistant from each other are also equidistant in the projected view. In this regard, the projection may be a simplified view of equidistant elements relative to each other shown in 2-dimensions. Such projection descriptions should not be seen as limiting, and are provided as a conceptual understanding that elements in the illumination pathway 304 may be arranged to provide for various arrangements of measurement regions 346 on the sample 118. For example, elements of the tilt-illumination columns 212 may be arranged in a hexagonal array as shown in FIG. 5 to provide for measurement region 346 arrangements that are also hexagonal. For example, three-hundred and thirty-one measurement regions 346 may be arranged in a hexagon shape as shown.

Figure 6:
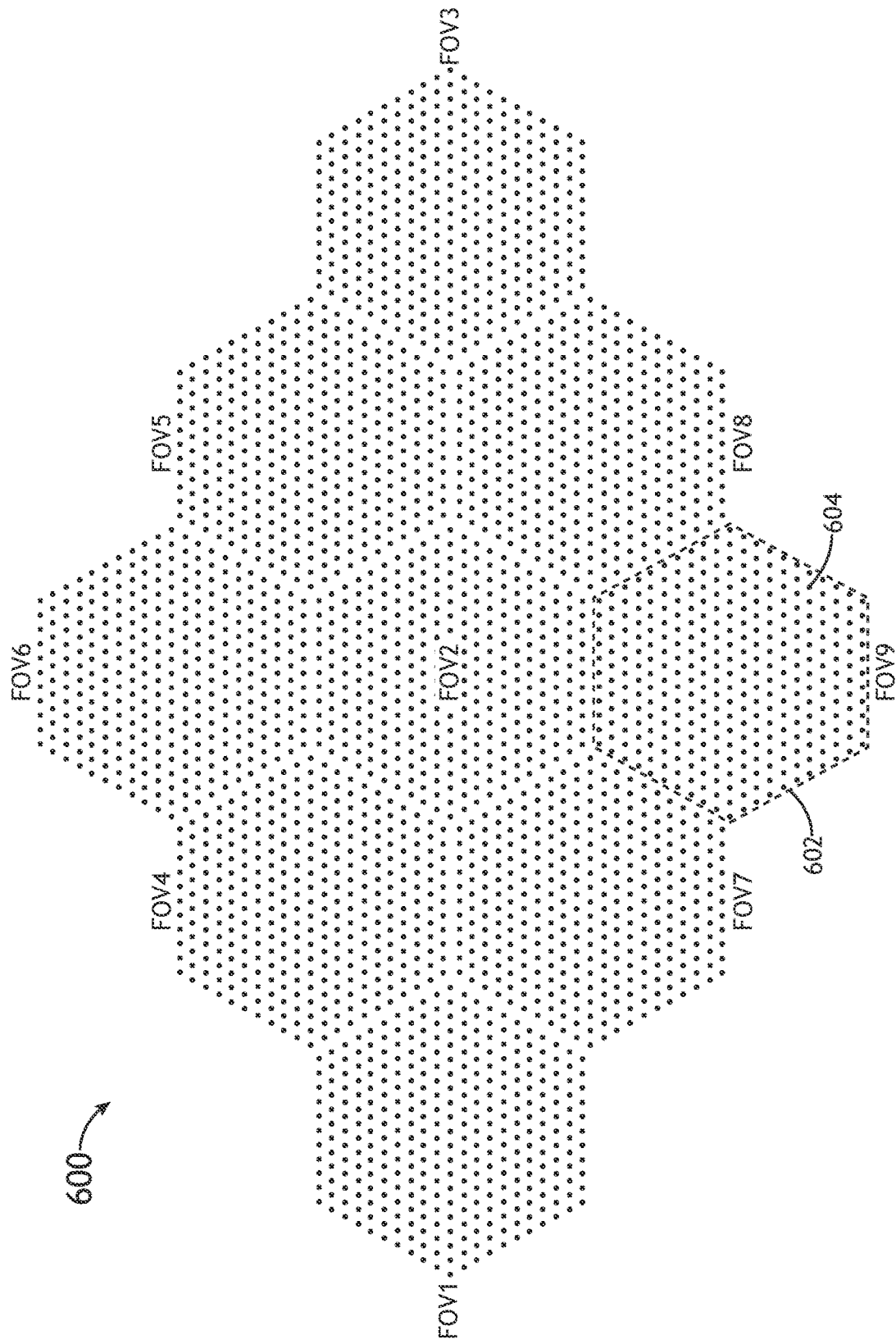
FIG. 6 is a schematic view of a set of seamlessly matched hexagonal field of view arrays, in accordance with one or more embodiments of the present disclosure.

FIG. 6 illustrates a schematic view 600 of a set of seamlessly matched hexagonal field of view arrays 602, in accordance with one or more embodiments of the present disclosure. A hexagonal field of view array 602 may be advantageous over other field of view arrays (e.g., such as circular arrays) due to an ability to provide for seamless matching between arrays of measurement regions 346. In embodiments, the field of view arrays 602 are measured in a process for measuring a sample 118. In a first step, a first field of view array (not labeled) is measured. In a second step, a second field of view array (not labeled) is measured. For example, the field of view arrays 602 may be located relative to each other in such a process such that no gaps are located between the field of view arrays 602. Such steps may be performed by controller 204. In this regard, a sample 118 (e.g., wafer) that is hundreds of millimeters in diameter may be seamlessly covered with many hexagonally arranged FOVs 604. For instance, each FOV 604 may have a size of hundreds of microns.

Figure 7:
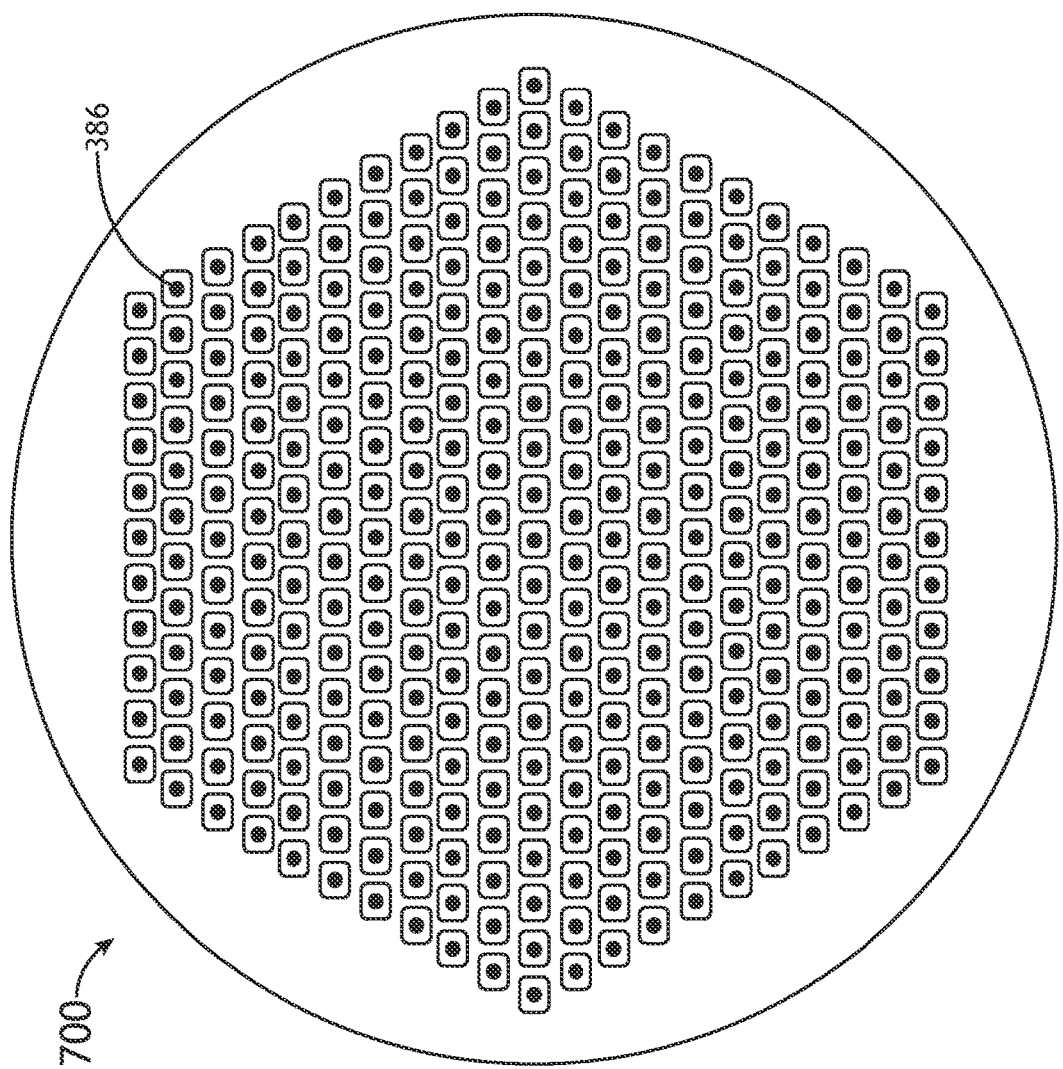
FIG. 7 is a schematic view of a 2-dimensional projection of a spherical gun focusing lens layer of a gun lens array, in accordance with one or more embodiments of the present disclosure.

FIG. 7 illustrates a schematic view 700 of a 2-dimensional projection of a spherical gun focusing lens layer of a gun lens array 352, in accordance with one or more embodiments of the present disclosure. In embodiments, an arrangement of the gun lens elements 386 of the gun lens array 352 may be hexagonal as shown.

In embodiments, each gun lens element 386 is separated from the other gun lens elements 386 to allow for individually applying a focusing voltage to each gun lens element 386. Such separation of gun lens elements 386 is also shown in FIG. 4. For example, a voltage distribution sub-system (not shown) may include a voltage regulator electrically coupled (e.g., via a respective wire) to each gun lens element 386 and a controller configured to adjust the focusing voltage applied to each gun lens element 386. By way of another example, each gun lens element 386 may be rectangular (as shown), square, or cylindrical. In examples, the void of each gun lens element 386 may have a size of roughly tens of millimeters.

Note that a gap between each gun lens element 386 may be relatively small because the potential difference between each gun lens element 386 may be generally low. In this regard, the potential difference being low means that gun lens elements 386 have a negligible effect on beamlets 394 of adjacent gun lens elements 386. In embodiments, gun lens elements 386 may be integrated on (e.g., coupled to) an insulator (e.g., non-electrically-conductive) substrate (not shown). Power wires (not shown) for applying focusing voltage may be integrated underneath the gaps to avoid re-distributing the electrostatic fields of focusing lenses.

Figure 8:
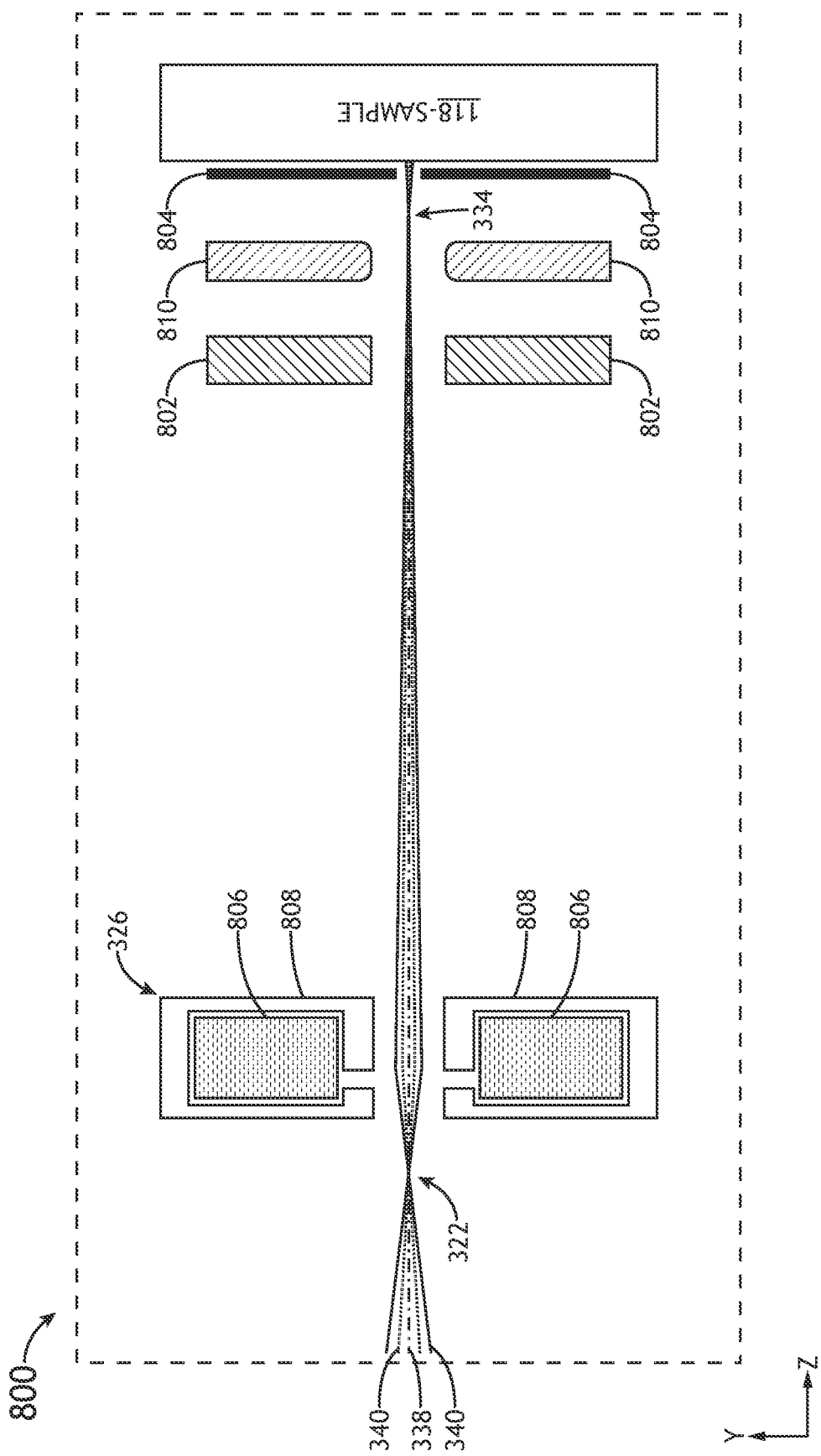
FIG. 8 is a simplified schematic view of projection optics of a tilt-column electron beam imaging system, in accordance with one or more embodiments of the present disclosure.

FIG. 8 illustrates a simplified schematic view 800 of projection optics of a tilt-column electron beam imaging system 200, in accordance with one or more embodiments of the present disclosure.

In embodiments, the tilt-column electron beam imaging system 200 includes a global transfer lens 326, a ground electrode 802, an accelerating and focusing electrode 810, and/or a charge control plate 804.

Referring back to FIG. 3A, the objective lens 332 may include a magnetic and/or electrostatic objective lens. For example, the objective lens 332 may include a magnetic section (not labeled) and an electrostatic section (not labeled). For instance, an electric field of the electrostatic section may be used to accelerate and/or decelerate the beamlet electron energy before the primary electrons land on the sample 118, and a magnetic field of the magnetic section may be used to focus the primary electron beams on the sample 118. By way of another example, the objective lens 332 may include an electrostatic lens without a magnetic lens. For instance, an objective lens 332 may include the ground electrode 802, the accelerating and focusing electrode 810, and/or the charge control plate 804.

In embodiments, the charge control plate 804 is configured to selectively charge the sample 118 for a particular (selected) extracting field for inspecting and/or reviewing specific (selected) layers of the sample 118 at a particular depth. For example, a lower layer at a certain depth of the sample 118 may be measured by changing a voltage of the charge control plate 804 to selectively adjust the charge applied to the sample 118 to cause the beamlets 394 to penetrate the sample 118 at a select distance (or range of distances) and be used for measuring such a lower layer.

In embodiments, the accelerating and focusing electrode 810 is used to accelerate the primary electrons of the beamlets 394 to reduce Coulomb interactions. For example, the accelerating and focusing electrode 810 may be located near the second common crossover volume 334. For instance, such a location may be desirable to combat Coulomb interactions that are especially strong near the second common crossover volume 334. In some examples, the accelerating and focusing electrode 810 may alternatively, or in addition, be used to focus the beamlets 394. For example, the accelerating and focusing electrode 810 may adjust a focus plane of the beamlets 394 to be at a particular (selected) location/depth of the sample 118.

The global transfer lens 326 may be any lens. For example, the global transfer lens 326 may be an electrostatic or magnetic lens. Note that a magnetic lens may provide for better optical properties in at least some embodiments. In embodiments, a magnetic version of the global transfer lens 326 may be provided for as shown in FIG. 8. For example, global transfer lens 326 may include magnetic coils 806 configured to bear excitation currents. Further, such magnetic coils 806 may be shielded by a magnetic pole 808.

Figure 9A:
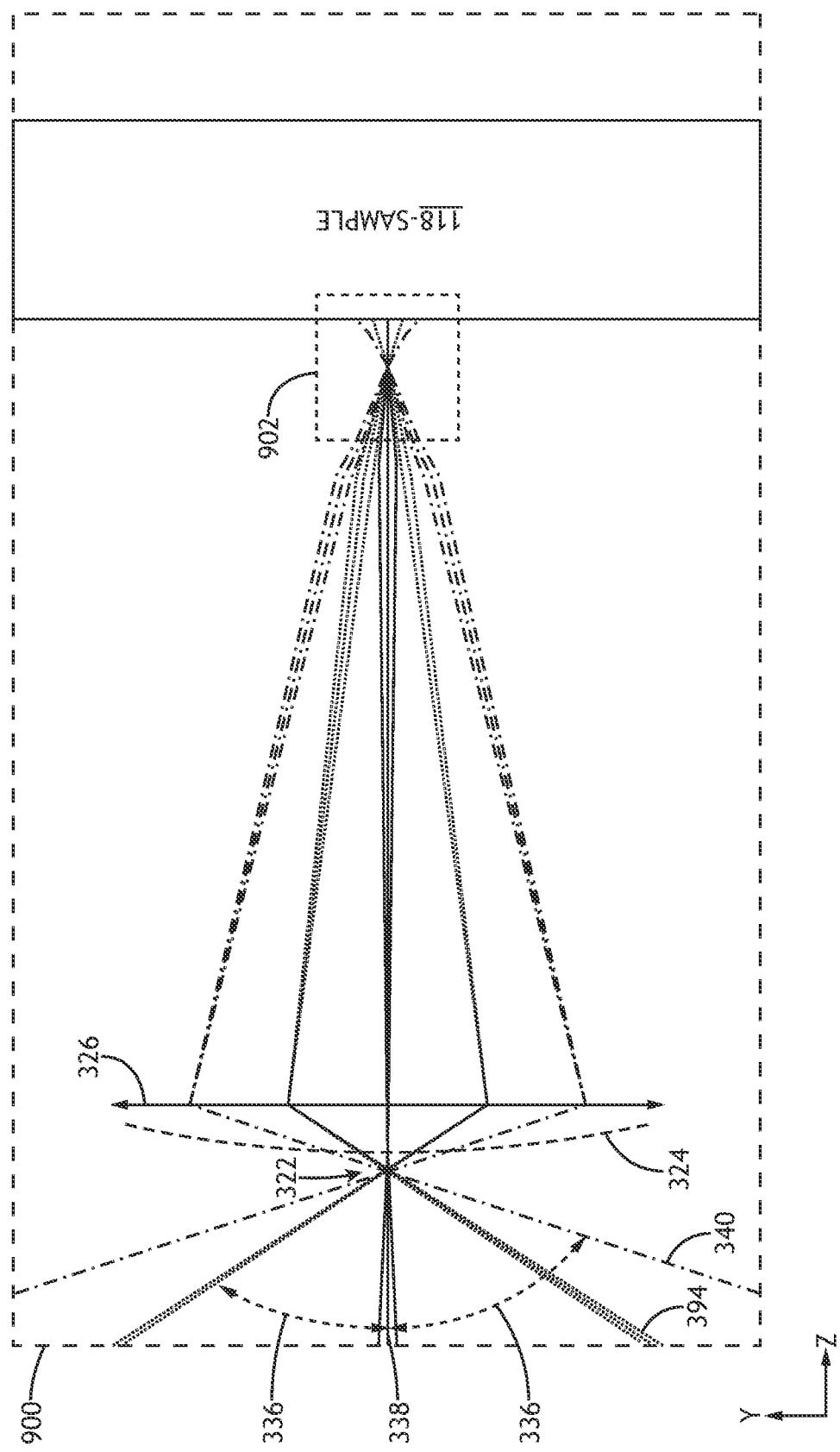
FIG. 9A is a vertically expanded simplified schematic view of primary electron trajectories and image forming relations of FIG. 8, in accordance with one or more embodiments of the present disclosure.

FIG. 9A illustrates a vertically expanded simplified schematic view 900 of primary electron trajectories and image forming relations of FIG. 8, in accordance with one or more embodiments of the present disclosure. For example, FIG. 9A may be produced by ray-tracing simulations with computer modeling of the elements of FIG. 8.

Figure 9B:
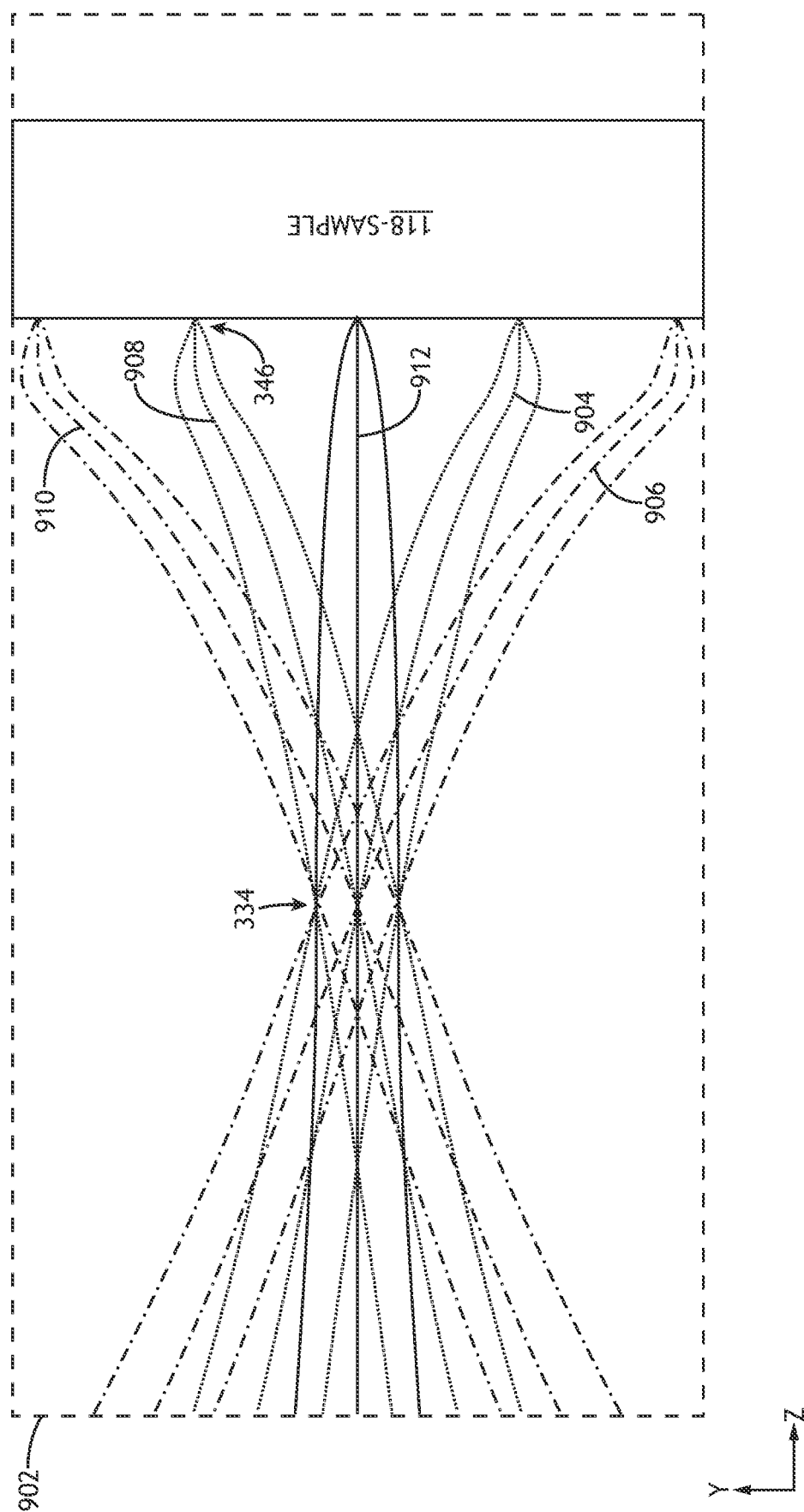
FIG. 9B is an expanded simplified schematic view of a portion of FIG. 9A including image-forming relations near the sample, in accordance with one or more embodiments of the present disclosure.

FIG. 9B illustrates an expanded simplified schematic view 902 of a portion of FIG. 9A including image-forming relations near the sample 118, in accordance with one or more embodiments of the present disclosure. As shown, a crossing of paths of beam rays 904, 906, 908, 910 across a central beam ray 912 parallel to the Z-axis is illustrated. Further, the telecentricity of beam rays 904, 906, 908, 910 near the sample 118 is shown.

Figure 10:
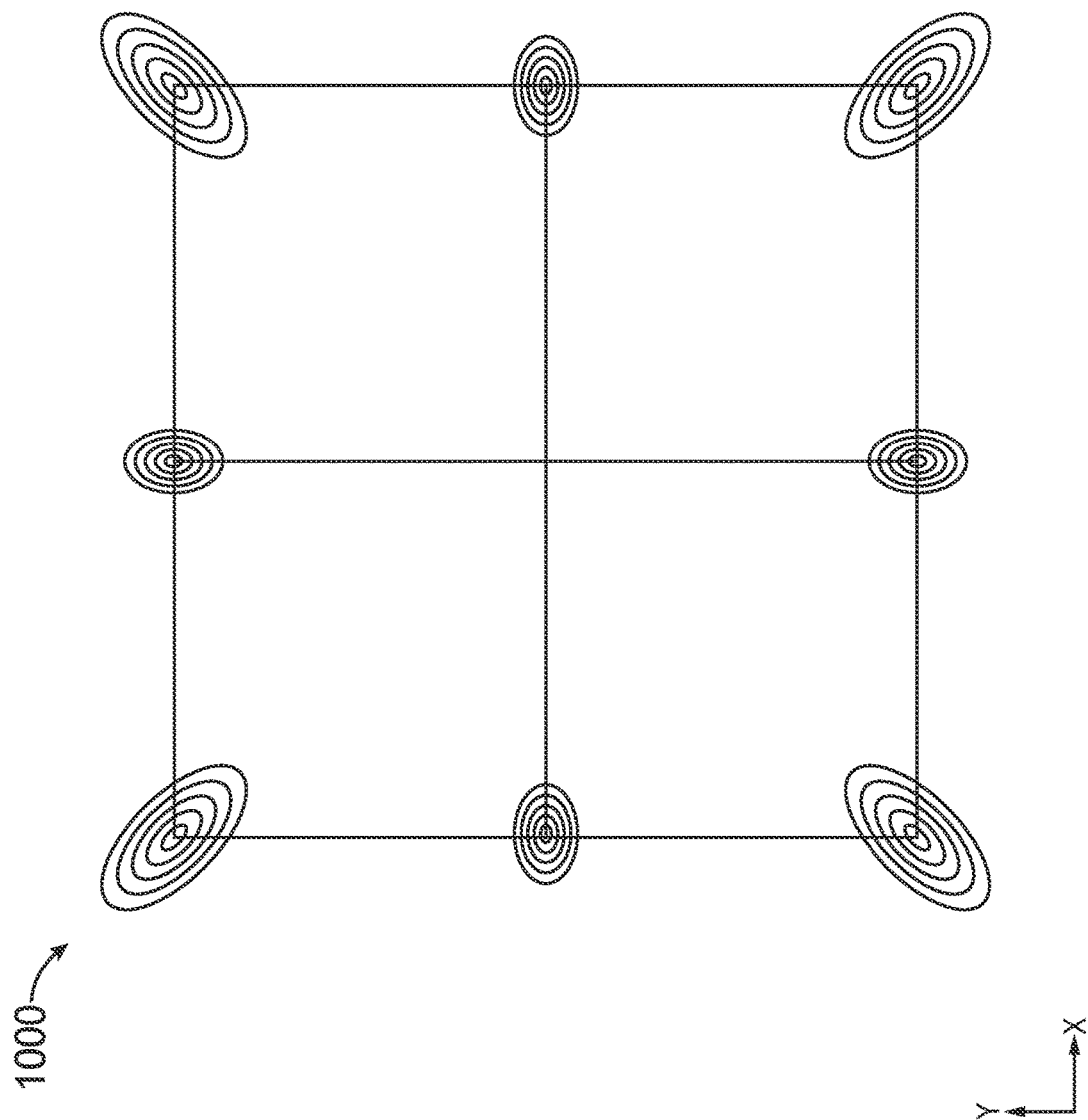
FIG. 10 is a conceptual view of image-formations across a field of view before astigmatism and field curvature corrections, in accordance with one or more embodiments of the present disclosure.
Figure 11:
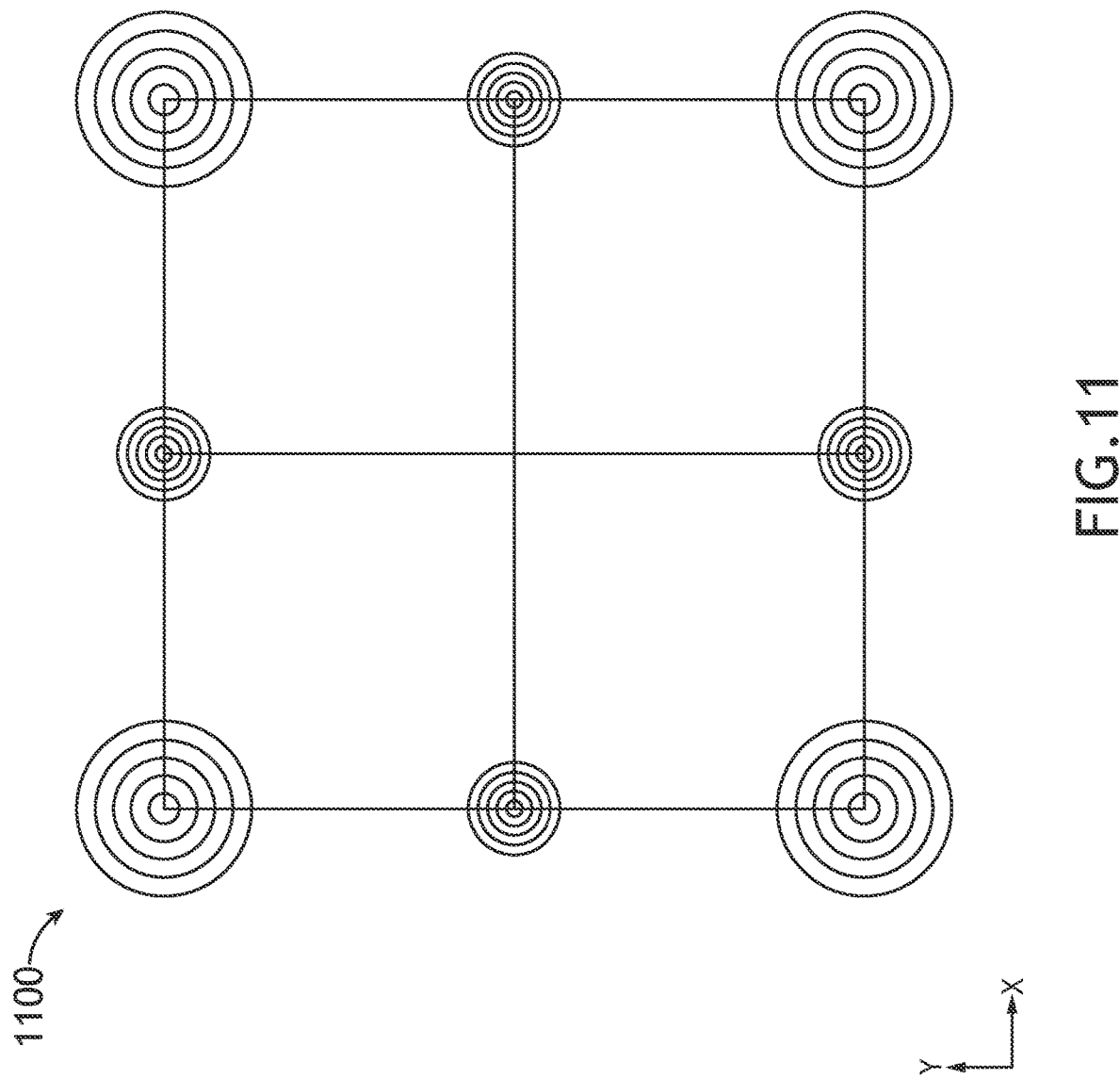
FIG. 11 is a conceptual view of image-formations across the field of view of FIG. 10 after astigmatism correction, in accordance with one or more embodiments of the present disclosure.
Figure 12:
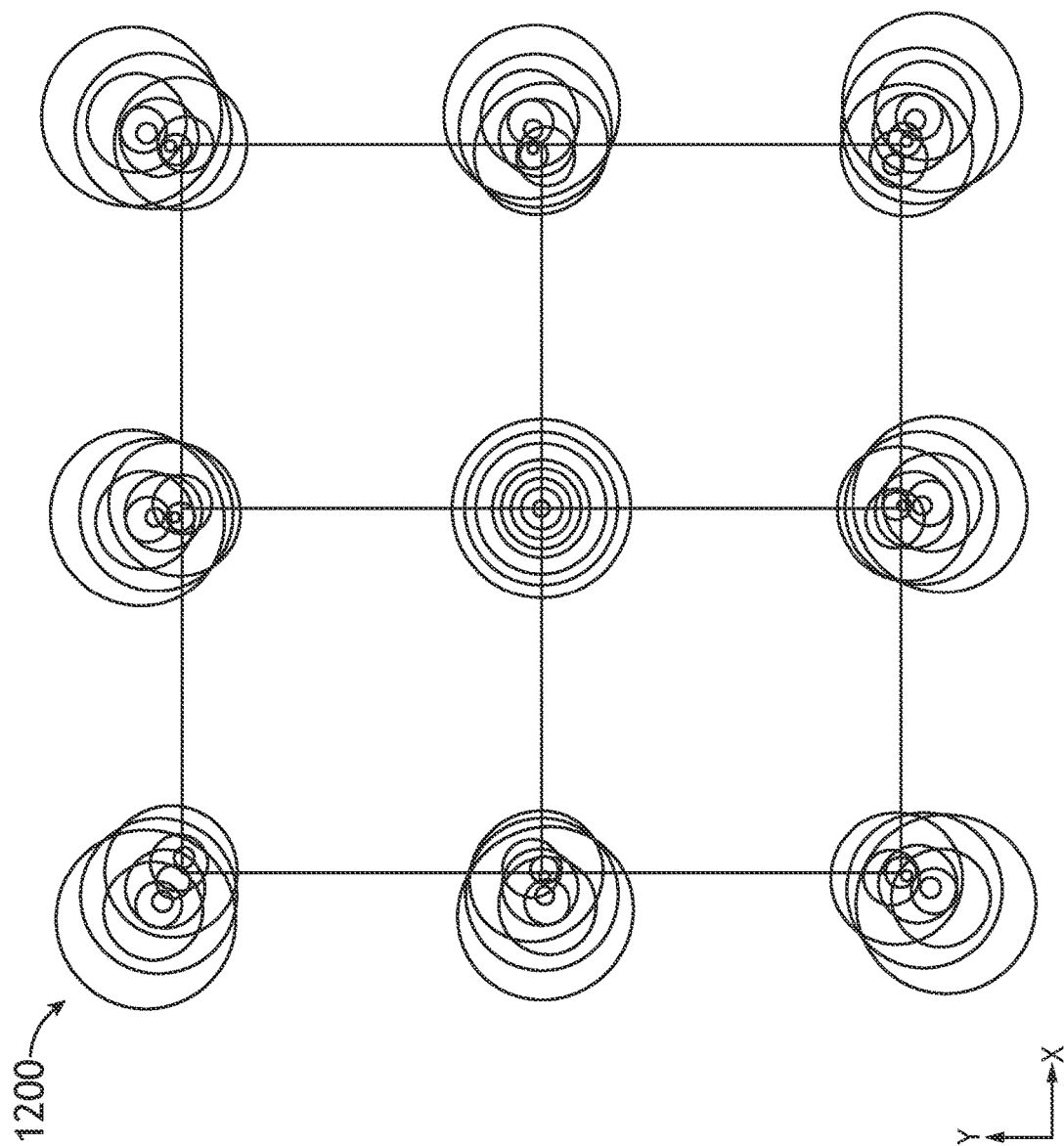
FIG. 12 is a conceptual view of image-formations across the field of view of FIG. 11 after field curvature correction, in accordance with one or more embodiments of the present disclosure.

FIGS. 10-12 illustrate image-formations across a field of view (i.e., measurement region 346) before and after corrections. As noted previously herein, the tilt-illumination columns 212 may allow for adjusting and correcting for astigmatism and/or field curvature of each beamlet 394. Optical performance of the tilt-column electron beam imaging system 200 of FIG. 3A may be characterized by metrics such as resolution (or spot size) of the beamlets 394, size of the field of view, and beamlet image uniformity across the field of view. FIGS. 10-12 may illustrate example computer simulations to evaluate these metrics.

FIG. 10 illustrates a conceptual view 1000 of image-formations across a field of view before astigmatism and field curvature corrections, in accordance with one or more embodiments of the present disclosure. The beamlet spot size is shown with 10 closed-lines according to a distribution of the beamlet electrons on the sample 118. A square FOV of 240×240 µm at the wafer is considered, although such a consideration is merely for illustrative purposes and is not to be seen as necessarily limiting to the size or shape of a FOV. In this example, not to be seen as limiting, a corner-to-corner distance of the image-formations of FIG. 10 are considered to be equal to a farthest corner-to-corner distance of the hexagonal field of view arrays 602 of FIG. 6. FIG. 10 illustrates that the projection optics of FIG. 8 may (e.g., without correction) result in relatively large off-axis blurs of astigmatism and field curvature.

FIG. 11 illustrates a conceptual view 1100 of image-formations across the field of view of FIG. 10 after astigmatism correction, in accordance with one or more embodiments of the present disclosure. In embodiments, astigmatism may be corrected, for example, with the modulator array 354 of FIG. 4. Correction of astigmatism in a multi-beam scanning electron microscopy system is disclosed in U.S. Pat. No. 10,497,536, issued Dec. 3, 2019, which is hereby incorporated by reference in its entirety. After the astigmatism is corrected, the field curvature blur is illustrated as dominating the spot sizes.

FIG. 12 illustrates a conceptual view 1200 of image-formations across the field of view of FIG. 11 after field curvature correction (and astigmatism correction), in accordance with one or more embodiments of the present disclosure. In embodiments, the field curvature blur is corrected by the gun lens array 352 of FIG. 4. For example, each gun lens element 386 may be configured for independently adjustable focusing voltages. In this regard, fine-tuning each gun lens focusing voltage may allow for correcting the blurs of field curvatures of each beamlet 394 individually. For instance, fine-tuning the focusing voltages may cause a change in position of the beamlet crossover 316 position shown in FIG. 3A. Such a correction of field curvature blur may lead to each beamlet 394 being independent without (or with reduced) cross-talk to other beamlets 394.

Referring to FIG. 12, the beamlet images across the FOV are now homogeneous although certain coma blurs may, in some embodiments, still exist. In embodiments, such coma blurs are negligible when viewing at certain scales (e.g., sizes of FOV). An electron-spot of beamlets 394 may have any distribution at the sample 118. In embodiments, the electron-spot is commonly a Gaussian-like distribution. Further, in embodiments, the spot size is commonly measured with a central portion of electrons. For example, a full width of the distribution in an FW50 spot size is when 50% of electrons are included. For instance, an FW50 distribution measurement size is represented by the 5th circle in a central spot of concentric circles shown in FIG. 12.

Figure 13:
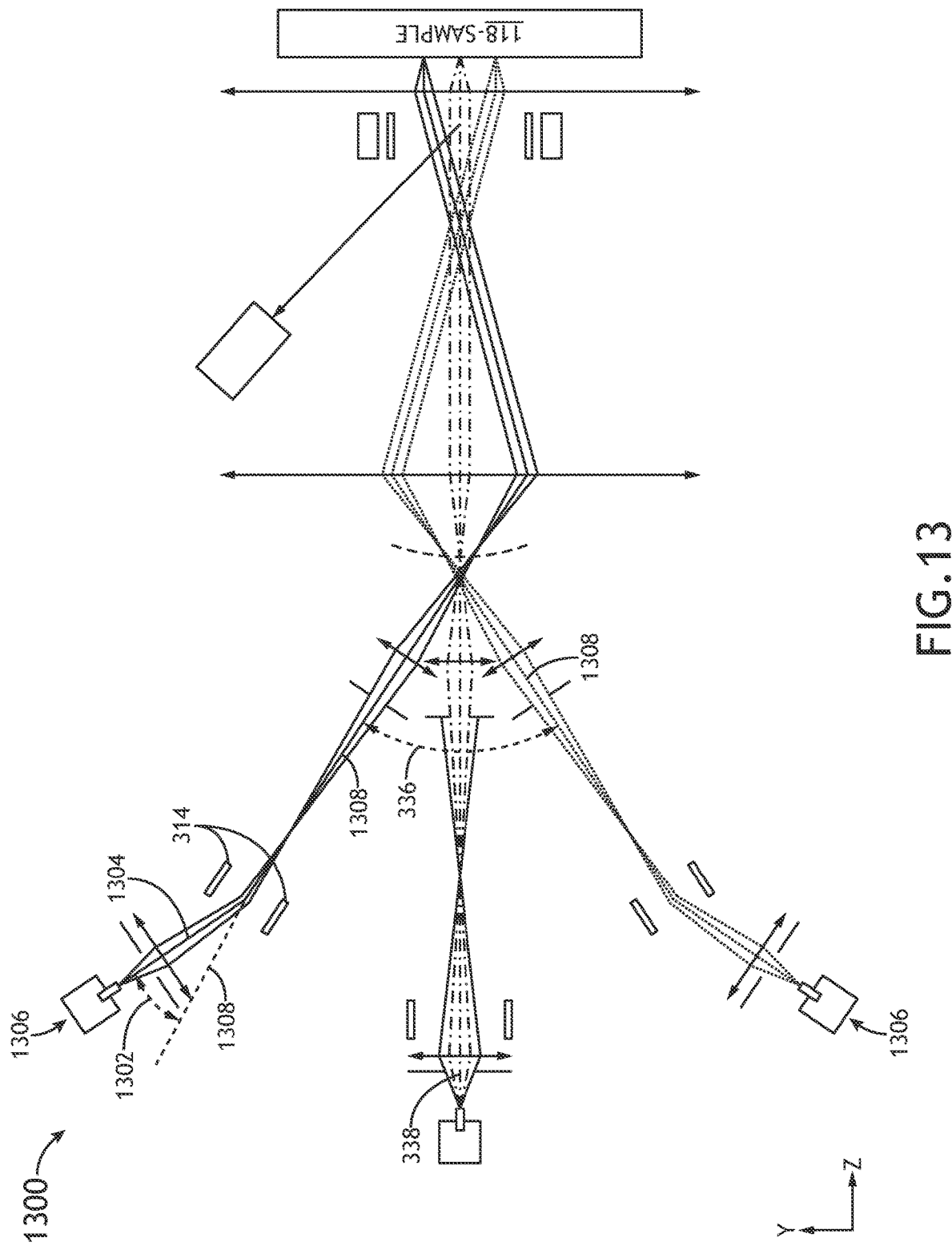
FIG. 13 is a simplified schematic view of a double-tilt-column electron beam imaging system, in accordance with one or more embodiments of the present disclosure.

FIG. 13 illustrates a simplified schematic view of a double-tilt-column electron beam imaging system 1300, in accordance with one or more embodiments of the present disclosure. In embodiments, the imaging sub-system 202 includes a set of double-tilt-illumination columns 1306. For example, the tilt-illumination columns 212 may be (or include) double-tilt-illumination columns 1306. A double-tilt may allow for even more separation between illumination columns than a single tilt. Benefits may include reduced heat accumulation, more space/clearance for components. For example, more pitch between each gun lens 312 may be provided by a double-tilt configuration. More pitch between gun lenses 312 may result in reduced cross-talks between beamlets 394 by virtue of less overlap in an electrostatic focusing field of each gun lens 312, and more clearance for arranging and integrating a focusing voltage of the gun lenses 312.

In embodiments, each double-tilt-illumination column 1306 includes a modulator 314. For example, the modulator 314 may be used to modulate (e.g., deflect) the beamlet 394 along a different axis. For instance, although not shown in FIG. 13, a modulator array may include the modulators 314 in a single layer.

In embodiments, each beamlet 394 of each double-tilt-illumination column 1306 is directed, via the modulator 314 from being orientated along a first double-tilt axis 1304 to a second double-tilt axis 1308. An angle between the second double-tilt axis 1308 and the first double-tilt axis 1304 may be referred to as an inter-axis angle 1302. In this regard, two axes may provide for two angles of tilt of the tilt-illumination column 212. Note that any number of axes and modulators 314 may be used to provide for any number of angles of tilt of a tilt-illumination column 212.

Figure 14:
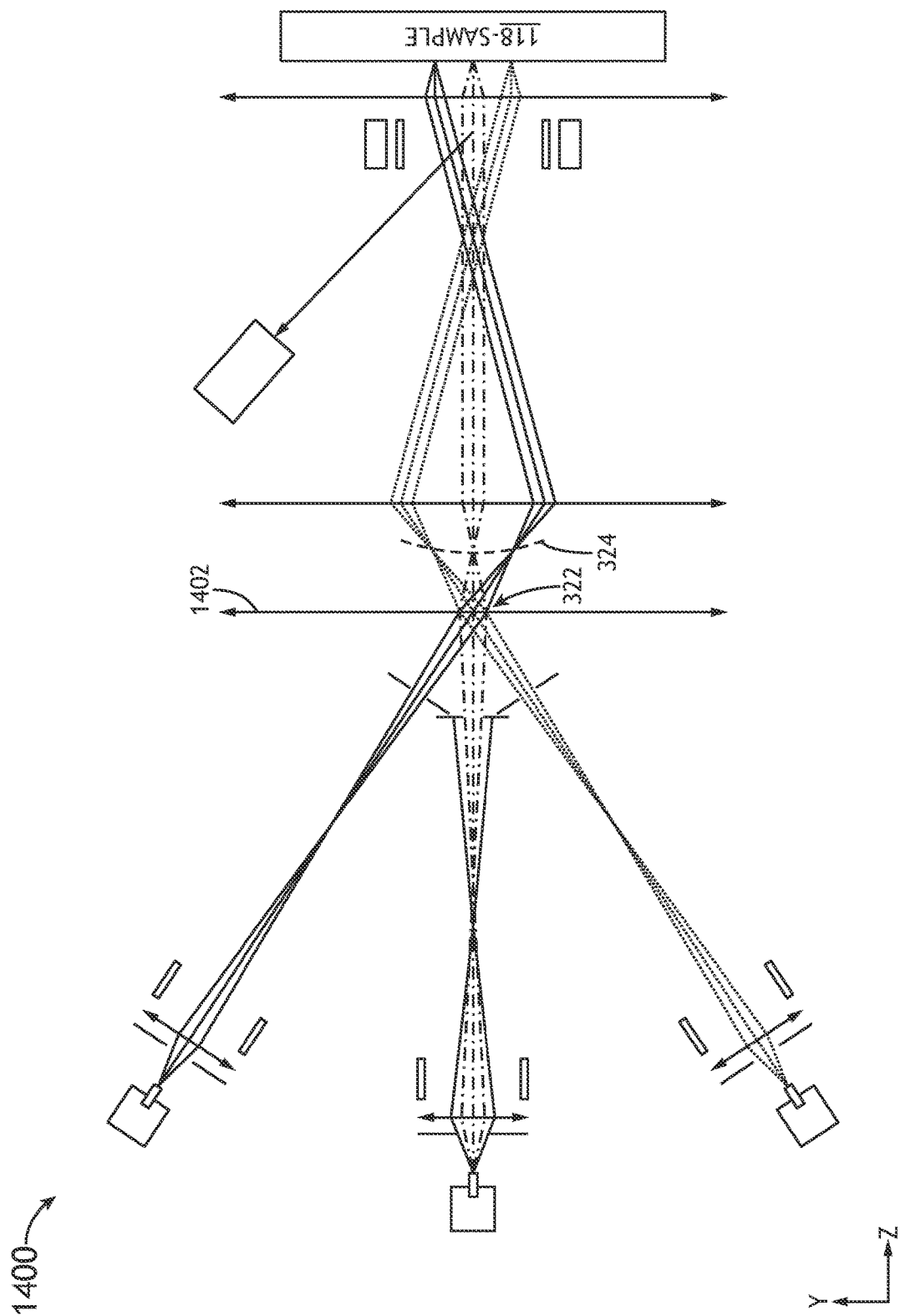
FIG. 14 is a simplified schematic view of a tilt-column electron beam imaging system including a global condenser lens, in accordance with one or more embodiments of the present disclosure.

FIG. 14 illustrates a simplified schematic view of a tilt-column electron beam imaging system 1400 including a global condenser lens 1402, in accordance with one or more embodiments of the present disclosure. For example, rather than an array of individual condenser lens elements, a single global condenser lens 1402 may be used to adjust all beamlets 394. Benefits of a global condenser lens 1402 may include being easier to manufacture larger components of a global condenser lens 1402 compared to smaller components of individual condenser lenses, and relatively less geometric aberration blurs caused by a global condenser lens 1402. For example, a global condenser lens 1402 may be more easily made with less sophisticated and less costly machining tools. For example, referring to FIG. 3C, the condenser lens array 358 may generate spherical aberration blurs in the intermediate image plane 324 because the hole size and pitches between each condenser element 320 may be on the order of hundreds of microns. In embodiments, such spherical aberration blurs may be reduced or eliminated using a global condenser lens 1402 because the bore size of a void of a global condenser lens 1402 may be, but is not required to be, on the order of tens of millimeters (e.g., 10 mm or more, 20 mm or more, 30 mm or more, 50 mm or more, 100 mm or more).

In embodiments, the global condenser lens 1402 is configured to adjust an intermediate image plane 324 of the beamlets 394. In embodiments, the global condenser lens 1402 overlaps with the first common crossover volume 322.

Figure 15:
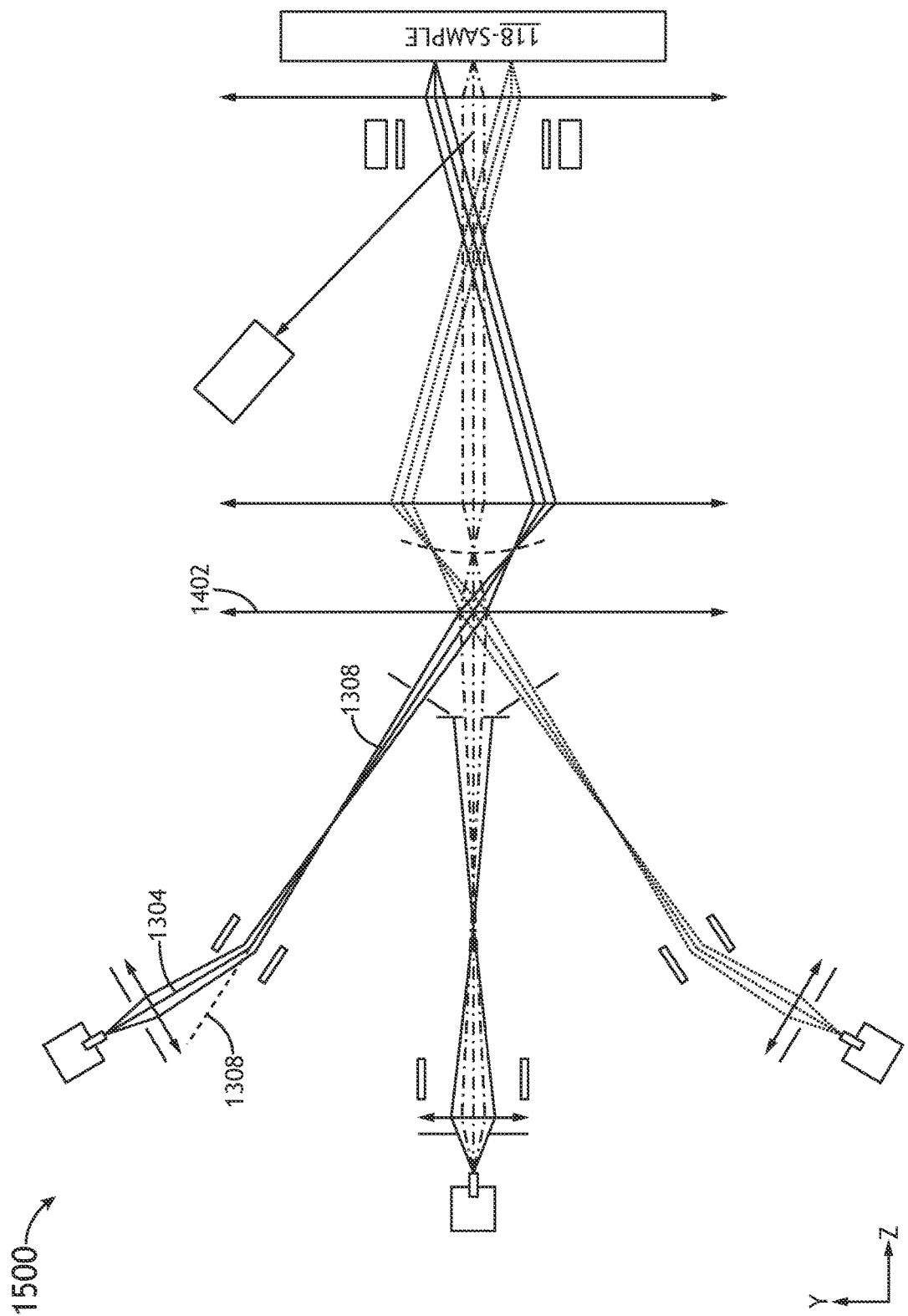
FIG. 15 is a simplified schematic view of a double-tilt-column electron beam imaging system including a global condenser lens, in accordance with one or more embodiments of the present disclosure.

FIG. 15 illustrates a simplified schematic view of a double-tilt-column electron beam imaging system 1500 including a global condenser lens 1302, in accordance with one or more embodiments of the present disclosure. In embodiments, a double-tilt setup of FIG. 13 may be combined with the global condenser lens 1302 of FIG. 14 to achieve both a double-tilt and a global condenser lens 1302. In embodiments, a double-tilt and global condenser lens setup provides for combined benefits as are each described in reference to FIGS. 13 and 14.

Figure 16:
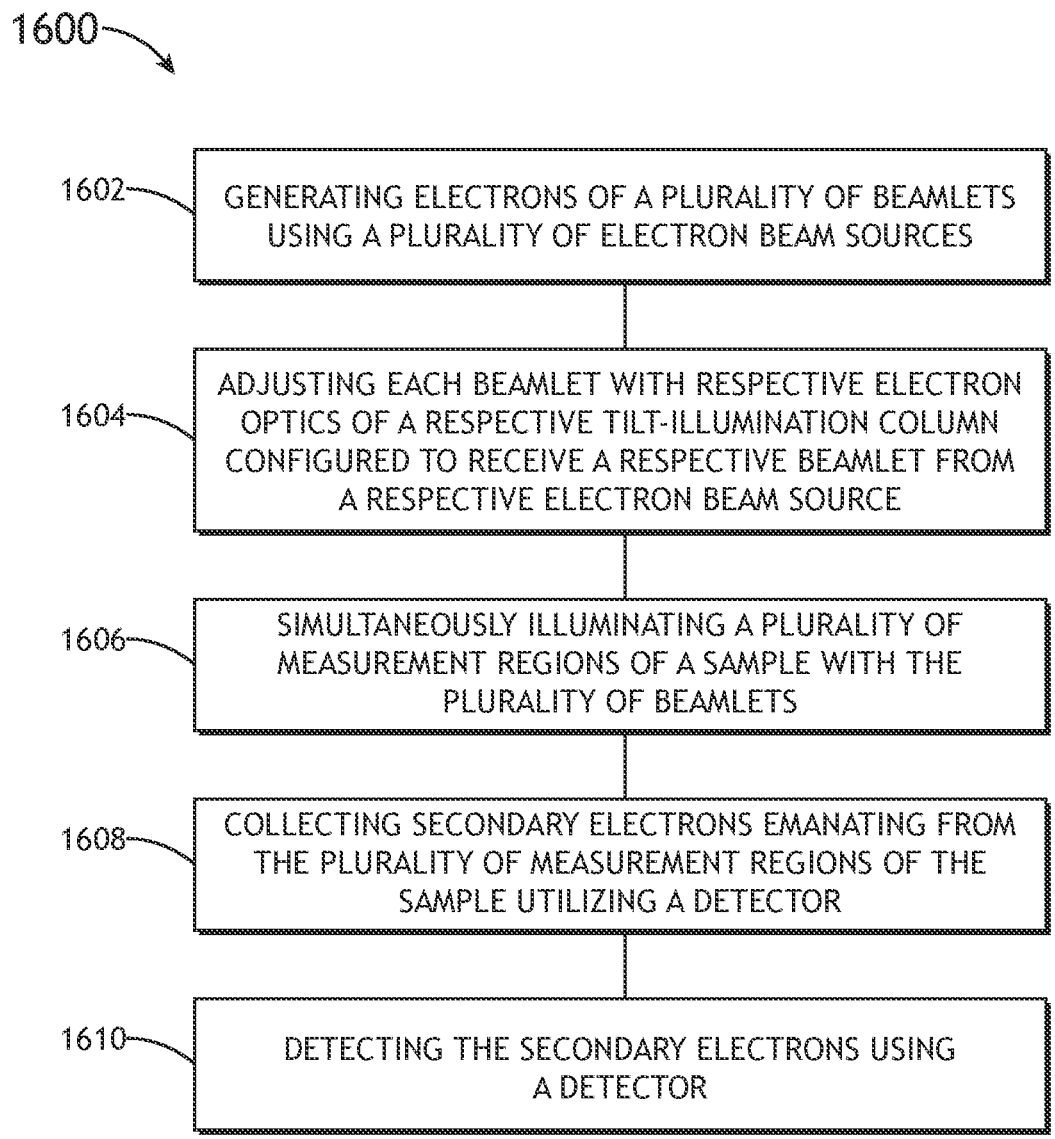
FIG. 16 is a flow diagram illustrating steps performed in a method, in accordance with one or more embodiments of the present disclosure.

FIG. 16 illustrates a flow diagram of steps performed in a method 1600, in accordance with one or more embodiments of the present disclosure. It is recognized, however, that the method 1600 is not limited to the tilt-column electron beam imaging system 200 in that additional or alternative system-level embodiments may carry out all or part of the steps of method 1600.

In a step 1602, electrons of a plurality of beamlets 394 are generated using a plurality of electron beam sources 214. For example, a first tilt axis 340 of a first tilt-illumination column 212 may be orientated along a first angle (e.g., relative to an arbitrary z axis) and at least one additional tilt axis 340 of at least one additional tilt-illumination column 212 may be orientated along at least one additional angle different from the first angle. Further, for instance, each of the plurality of beamlets 394 may pass through a first common crossover volume 322.

In a step 1604, each beamlet 394 is adjusted with respective electron optics 220 of a respective tilt-illumination column 212 configured to receive the beamlet 394 from a respective electron beam source. For example, astigmatism and field curvature blur may be corrected for.

In a step 1606, a plurality of measurement regions 346 of a sample 118 are simultaneously illuminated with the plurality of beamlets 394. For example, to increase yield in an inspection process, many beamlets 394 may simultaneously (or near simultaneously) be used to image many measurement regions 346 of the sample 118.

In a step 1608, secondary electrons emanating from the plurality of measurement regions 346 of the sample 118 are collected utilizing a detector 216. It should be noted that such a description is non-limiting and backscattered electrons may also be collected.

In a step 1610, the secondary electrons are detected using the detector 216. For example, an image (e.g., SEM image) of each measurement region 346 may be generated based on the detected secondary electrons.

In an optional step, one or more characteristics of the sample 118 are determined based on the detecting of the secondary electrons of step 1610.

Referring again to FIGS. 2-16, embodiments and various components are described in additional detail.

In embodiments, tilt-column electron beam imaging system 200 includes a sample stage 396 configured to secure a sample 118. The sample stage 396 may include any sample stage known in the art of electron-beam microscopy. In embodiments, the sample stage 396 is an actuatable stage. For example, the sample stage 396 may include, but is not limited to, one or more translational stages suitable for selectably translating the sample 118 along one or more linear directions (e.g., x-direction, y-direction and/or z-direction). By way of another example, the sample stage 396 may include, but is not limited to, one or more rotational stages suitable for selectively rotating the sample 118 along a rotational direction. By way of another example, the sample stage 396 may include, but is not limited to, a rotational stage and a translational stage suitable for selectably translating the sample along a linear direction and/or rotating the sample 118 along a rotational direction.

The sample 118 may include any sample suitable for characterization (e.g., inspection or review) with electron-beam microscopy. In embodiments, the sample 118 includes a wafer, die, chip, or the like. For example, the sample may include, but is not limited to, a semiconductor wafer. As used through the present disclosure, the term "wafer" refers to a substrate formed of a semiconductor and/or a non-semiconductor material. For instance, in the case of a semiconductor material, the wafer may be formed from, but is not limited to, monocrystalline silicon, gallium arsenide, and/or indium phosphide. In another embodiment, the sample includes a photomask/reticle. In embodiments, the sample 118 includes a mask such as a reticle mask, lithography mask, and the like.

The detector 216 may include any type of electron detector assembly known in the art configured to detect electrons (e.g., secondary and/or backscattered electrons). For example, the secondary electrons may be collected and imaged using an Everhart-Thornley detector (or other type of scintillator-based detector). In another embodiment, secondary electrons may be collected and imaged using a micro-channel plate (MCP). In another embodiment, electrons may be collected and imaged using a PIN or p-n junction detector, such as a diode or a diode array. In another embodiment, electrons may be collected and imaged using one or more avalanche photo diodes (APDs).

As noted previously herein, the one or more processors 206 of the controller 204 may be communicatively coupled to memory 208, where the one or more processors 206 may be configured to execute a set of program instructions maintained in memory 208, and the set of program instructions may be configured to cause the one or more processors 206 to carry out various functions and steps of the present disclosure.

It is noted herein that the one or more components of tilt-column electron beam imaging system 200 may be communicatively coupled to the various other components of tilt-column electron beam imaging system 200 in any manner known in the art. For example, the one or more processors 206 may be communicatively coupled to each other and other components via a wireline (e.g., copper wire, fiber optic cable, and the like) or wireless connection (e.g., RF coupling, IR coupling, WiMax, Bluetooth, 3G, 4G, 4G LTE, 5G, and the like). By way of another example, the controller 204 may be communicatively coupled to one or more components of tilt-column electron beam imaging system 200 via any wireline or wireless connection known in the art.

In embodiments, the one or more processors 206 may include any one or more processing elements known in the art. In this sense, the one or more processors 206 may include any microprocessor-type device configured to execute software algorithms and/or instructions. In embodiments, the one or more processors 206 may consist of a desktop computer, mainframe computer system, workstation, image computer, parallel processor, or other computer system (e.g., networked computer) configured to execute a program configured to operate the tilt-column electron beam imaging system 200, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 206. In general, the term "processor" may be broadly defined to encompass any device having one or more processing elements, which execute program instructions from memory 208. Moreover, different subsystems of the tilt-column electron beam imaging system 200 (e.g., imaging sub-system 202, controller 204, user interface, and the like) may include processor or logic elements suitable for carrying out at least a portion of the steps described throughout the present disclosure. Therefore, the above description should not be interpreted as a limitation on the present disclosure but merely an illustration.

The memory 208 may include any storage medium known in the art suitable for storing program instructions executable by the associated one or more processors 206 and the data received from the tilt-column electron beam imaging system 200. For example, the memory 208 may include a non-transitory memory medium. For instance, the memory 208 may include, but is not limited to, a read-only memory (ROM), a random-access memory (RAM), a magnetic or optical memory (e.g., disk), a magnetic tape, a solid-state drive and the like. It is further noted that the memory 208 may be housed in a common controller housing with the one or more processors 206. In an alternative embodiment, the memory 208 may be located remotely with respect to the physical location of the processors 206, controller 204, and the like. In another embodiment, the memory 208 maintains program instructions for causing the one or more processors 206 to carry out the various steps described through the present disclosure.

In embodiments, the user interface is communicatively coupled to the controller 204. The user interface may include, but is not limited to, one or more desktops, tablets, smartphones, smart watches, or the like. In another embodiment, the user interface includes a display used to display data of the tilt-column electron beam imaging system 200 to a user. The display of the user interface may include any display known in the art. For example, the display may include, but is not limited to, a liquid crystal display (LCD), an organic light-emitting diode (OLED) based display, or a CRT display. Those skilled in the art should recognize that any display device capable of integration with a user interface is suitable for implementation in the present disclosure. In another embodiment, a user may input selections and/or instructions responsive to data displayed to the user via a user input device of the user interface.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," "downward", "X direction" and the like are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

Finally, as used herein any reference to "embodiments, "one embodiment", "some embodiments", or the like means that a particular element, feature, structure, or characteristic described in connection with the embodiment is included in at least one embodiment disclosed herein. The appearances of the phrase "in embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

What is claimed:

1. A tilt-column electron beam imaging system comprising:
    an imaging sub-system comprising:
        a plurality of electron beam sources configured to generate a plurality of beamlets to simultaneously probe a plurality of measurement regions on a sample;
        a collection pathway comprising one or more detectors; and
        an illumination pathway comprising:
            a plurality of tilt-illumination columns, wherein a respective tilt-illumination column is configured to receive a respective beamlet from a respective electron beam source, wherein the respective tilt-illumination column comprises:
                a set of one or more electron optics configured to adjust the respective beamlet,
    wherein a first tilt axis of a first tilt-illumination column is orientated along a first angle and at least one additional tilt axis of at least one additional tilt-illumination column is orientated along at least one additional angle different from the first angle, wherein each of the plurality of beamlets pass through a first common crossover volume.

2. The tilt-column electron beam imaging system of claim 1, wherein each electron beam source comprises one or more electron source emitter tips.

3. The tilt-column electron beam imaging system of claim 1, wherein each of the plurality of tilt-illumination columns comprises a gun lens.

4. The tilt-column electron beam imaging system of claim 1, wherein each of the plurality of tilt-illumination columns comprises a condenser lens.

5. The tilt-column electron beam imaging system of claim 1, wherein each of the plurality of tilt-illumination columns comprises a modulator, wherein the modulator is configured to at least one of deflect the respective beamlet or adjust the respective beamlet.

6. The tilt-column electron beam imaging system of claim 1, wherein each of the plurality of tilt-illumination columns comprises a beam limiting aperture.

7. The tilt-column electron beam imaging system of claim 6, wherein the beam limiting aperture is located before a gun lens relative to a direction of propagation of the respective beamlet.

8. The tilt-column electron beam imaging system of claim 1, wherein each of the plurality of tilt-illumination columns comprises a secondary beam limiting aperture.

9. The tilt-column electron beam imaging system of claim 8, wherein the secondary beam limiting aperture is located after a gun lens.

10. The tilt-column electron beam imaging system of claim 1, wherein the illumination pathway further comprises a global transfer lens configured to direct each of the plurality of beamlets from a diverging path to a converging path and towards a second common crossover volume, wherein the global transfer lens is located after the first common crossover volume.

11. The tilt-column electron beam imaging system of claim 1, wherein the illumination pathway further comprises a global condenser lens configured to adjust an intermediate image plane of the plurality of beamlets.

12. The tilt-column electron beam imaging system of claim 11, wherein the global condenser lens overlaps with the first common crossover volume.

13. The tilt-column electron beam imaging system of claim 1, wherein the illumination pathway further comprises a global objective lens configured to direct each of the plurality of beamlets to be telecentrically formed on the sample.

14. The tilt-column electron beam imaging system of claim 1, wherein the collection pathway further comprises a Wien filter configured to separate primary electrons from secondary electrons.

15. The tilt-column electron beam imaging system of claim 1, wherein the plurality of tilt-illumination columns comprises a plurality of double-tilt-illumination columns, wherein each double-tilt-illumination column comprises a modulator, wherein the beamlet of each double-tilt-illumination column is directed, via the modulator, from being orientated along a first double-tilt axis to a second double-tilt axis.

16. The tilt-column electron beam imaging system of claim 1, wherein the illumination pathway further comprises a central illumination column comprising a central electron beam source configured to generate a central beamlet along a central axis of the imaging sub-system.

17. The tilt-column electron beam imaging system of claim 1, wherein the plurality of tilt-illumination columns are arranged in an array.

18. The tilt-column electron beam imaging system of claim 17, wherein the array is a spherical array.

19. The tilt-column electron beam imaging system of claim 17, wherein the array is a hexagonal array.

20. The tilt-column electron beam imaging system of claim 1, wherein at least a portion of the set of the one or more electron optics are arranged in a set of layered arrays, wherein the set of layered arrays comprises:
   a beam limiting aperture array layer;
   a gun lens array layer; and
   an electrically grounded layer.

21. The tilt-column electron beam imaging system of claim 1, wherein each modulator is arranged in a modulator array.

22. The tilt-column electron beam imaging system of claim 1, wherein each electron beam source is arranged in an electron beam source array.

23. The tilt-column electron beam imaging system of claim 1, wherein the plurality of tilt-illumination columns are radially arranged.

24. The tilt-column electron beam imaging system of claim 1, wherein the plurality of beamlets are radially arranged normal to a 3-dimensional curved plane.

25. The tilt-column electron beam imaging system of claim 24, wherein the 3-dimensional curved plane is a portion of a sphere.

26. A method comprising:
   generating electrons of a plurality of beamlets using a plurality of electron beam sources;
   adjusting each beamlet with respective electron optics of a respective tilt-illumination column configured to receive the beamlet from a respective electron beam source;
   simultaneously illuminating a plurality of measurement regions of a sample with the plurality of beamlets;
   collecting secondary electrons emanating from the plurality of measurement regions of the sample using a detector; and
   detecting the secondary electrons using the detector,
   wherein a first tilt axis of a first tilt-illumination column is orientated along a first angle and at least one additional tilt axis of at least one additional tilt-illumination column is orientated along at least one additional angle different from the first angle, wherein each of the plurality of beamlets pass through a first common crossover volume.

27. The method of claim 26 further comprising determining one or more characteristics of the sample based on the detecting of the secondary electrons.

28. The method of claim 26 further comprising adjusting the beamlets using a global condenser lens configured to adjust an intermediate image plane of the plurality of beamlets.

29. The method of claim 26, wherein each tilt-illumination column includes a modulator, wherein each beamlet is directed, via the modulator, from being orientated along a respective first double-tilt axis to a respective second double-tilt axis.

* * * * *